(12) United States Patent
Kim

(10) Patent No.: US 9,715,853 B2
(45) Date of Patent: Jul. 25, 2017

(54) ORGANIC LIGHT EMITTING DIODE DISPLAY AND METHOD FOR DRIVING THE SAME

(71) Applicant: LG Display Co., Ltd., Seoul (KR)

(72) Inventor: Dongjun Kim, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 5 days.

(21) Appl. No.: 15/068,483

(22) Filed: Mar. 11, 2016

(65) Prior Publication Data

US 2017/0132977 A1   May 11, 2017

(30) Foreign Application Priority Data

Nov. 11, 2015 (KR) ........................ 10-2015-0158249

(51) Int. Cl.
  *G06F 3/041* (2006.01)
  *G09G 3/3266* (2016.01)
  *G09G 3/3225* (2016.01)

(52) U.S. Cl.
  CPC ......... *G09G 3/3266* (2013.01); *G09G 3/3225* (2013.01); *G09G 2300/0809* (2013.01); *G09G 2300/0823* (2013.01); *G09G 2310/0202* (2013.01); *G09G 2310/0262* (2013.01); *G09G 2320/0295* (2013.01)

(58) Field of Classification Search
  CPC .. G09G 3/36; G09G 5/00; G09G 3/34; G09G 5/10; G09G 5/02; G11C 19/00; G06F 3/038
  See application file for complete search history.

(56) References Cited

U.S. PATENT DOCUMENTS

| | | | |
|---|---|---|---|
| 9,076,387 B1 | 7/2015 | Lee et al. | |
| 2010/0123673 A1* | 5/2010 | Nam | G06F 3/0412 345/173 |
| 2013/0050292 A1* | 2/2013 | Mizukoshi | G09G 3/3291 345/690 |
| 2013/0342500 A1* | 12/2013 | Huang | G06F 3/0416 345/174 |
| 2014/0110683 A1* | 4/2014 | Huang | G06F 3/041 257/40 |

FOREIGN PATENT DOCUMENTS

| | | |
|---|---|---|
| CA | 2528641 A1 | 6/2006 |
| EP | 0905673 A1 | 3/1999 |
| EP | 2747066 A1 | 6/2014 |

OTHER PUBLICATIONS

European Extended Search Report, European Application No. 16163829.1, Oct. 4, 2016, 12 pages.

* cited by examiner

*Primary Examiner* — Pegeman Karimi
(74) *Attorney, Agent, or Firm* — Fenwick & West LLP

(57) ABSTRACT

An organic light emitting diode display and a method for driving the same are disclosed. The organic light emitting diode display includes a display panel including data lines and gate lines crossing each other, subpixels each including one or more thin film transistors (TFTs), and sensing paths connected to the subpixels. The display panel includes a first block including a plurality of subpixels having a first TFT structure, a second block including a plurality of subpixels having a second TFT structure different from the first TFT structure, and a sensing circuit which simultaneously senses the plurality of subpixels of the first block through the sensing path and simultaneously senses the plurality of subpixels of the second block through the sensing path.

20 Claims, 26 Drawing Sheets

— Average I-V curve of panel $Id = a' \times (Vdata - b')^c$

— Pixel I-V $$Id = a \times (Vdata - b)^c$$

Gate pattern shift →

ORGANIC LIGHT EMITTING DIODE DISPLAY AND METHOD FOR DRIVING THE SAME

CROSS-REFERENCE TO RELATED APPLICATION

This application claims the benefit of Korean Patent Application No. 10-2015-0158249 filed on Nov. 11, 2015, the entire contents of which is incorporated herein by reference for all purposes as if fully set forth herein.

BACKGROUND OF THE INVENTION

Field of the Invention

The present disclosure relates to an organic light emitting diode display for improving image quality based on a result of sensing changes in driving properties of pixels.

Discussion of the Related Art

An active matrix organic light emitting diode (OLED) display includes organic light emitting diodes (OLEDs) capable of emitting light by itself and has advantages of a fast response time, a high emission efficiency, a high luminance, and a wide viewing angle. Each OLED includes an anode, a cathode, and an organic compound layer formed between the anode and the cathode. The organic compound layer includes a hole injection layer HIL, a hole transport layer HTL, an emission layer EML, an electron transport layer ETL, and an electron injection layer EIL. When a driving voltage is applied to the anode and the cathode, holes passing through the hole transport layer HTL and electrons passing through the electron transport layer ETL move to the emission layer EML and form excitons. As a result, the emission layer EML generates visible light.

Each pixel of the OLED display includes a driving element controlling a current flowing in the OLED. The driving element may be implemented as a thin film transistor (TFT). It is preferable that electrical properties, such as a threshold voltage and a mobility of the driving element are equally designed in all of the pixels. However, the electrical properties of the driving TFT are not uniform due to process conditions, a driving environment, etc. As a driving time increases, a stress of the driving element increases. Further, the stress of the driving element varies depending on a data voltage. The electrical properties of the driving element are affected by the stress. Thus, the electrical properties of the driving TFTs vary as the driving time passed.

A method of compensating for changes in driving properties (or characteristics) of the pixels of the OLED display is classified into an internal compensation method and an external compensation method.

The internal compensation method automatically compensates for a variation in threshold voltages of the driving TFTs inside a pixel circuit. Because the current flowing in the OLED has to be determined irrespective of the threshold voltage of the driving TFT so as to implement the internal compensation, configuration of the pixel circuit becomes complicated. Further, it is difficult for the internal compensation method to compensate for a variation in mobilities of the driving TFTs.

The external compensation method senses the electrical properties (for example, the threshold voltage and the mobility) of the driving TFTs and modulates pixel data of an input image based on the result of sensing through a compensation circuit located outside a display panel, thereby compensating for changes in the driving property of each pixel.

The external compensation method directly receives a sensing voltage from each pixel through reference voltage lines (hereinafter referred to as "REF lines") connected to the pixels of the display panel, converts the sensing voltage into digital sensing data to generate a sensing value, and transmits the sensing value to a timing controller. The timing controller modulates digital video data of the input image based on the sensing value and compensates for changes in the driving property of each pixel.

As a result of recent increase in a resolution of the OLED display and efficiency of an organic compound, an amount of current (or a current required per pixel) required to drive each pixel has also sharply decreased. Further, an amount of sensing current, which is received from the pixel so as to sense changes in the driving property of the pixel, decreases. As the amount of sensing current decreases, a charge amount of a capacitor of a sample and hold circuit decreases in a limited sampling period. Thus, it is difficult to sense changes in the driving property of the pixel. The sampling period is defined by a switching signal determining charge timing of the capacitor of the sample and hold circuit. During the sampling period, the sample and hold circuit receives current from the pixel, charges the capacitor with charges, converts the current into a voltage, and samples the voltage of the pixel.

The OLED display applies a low gray level sensing data voltage to the pixel, so as to sense the driving property of the pixel at a low gray level. In this instance, the OLED display converts current flowing in the pixel into a voltage through the sample and hold circuit, samples the voltage of the pixel, and converts the sampled voltage into digital data (i.e., the sensing value) through an analog-to-digital converter (ADC), thereby sensing the driving property of the pixel at the low gray level.

Because an amount of current of the pixel at the low gray level decreases, an input voltage of the ADC obtained in the limited sampling period may be less than a minimum voltage the ADC can recognize. If the input voltage of the ADC does not exceed the minimum voltage the ADC can recognize, the driving property of the pixel at the low gray level cannot be sensed. If a length of a sensing period including the sampling period increases, the input voltage of the ADC at the low gray level may increase. However, there is a limit to an increase in the length of the sensing period. If the driving properties of the pixels at the low gray level are not sensed, a variation in the driving properties of the pixels at the low gray level cannot be compensated. Because a current of the pixel at a high gray level become large, driving properties of high-resolution and high-definition pixels at the high gray level can be easily sensed.

SUMMARY OF THE INVENTION

Embodiments relate to an organic light emitting diode display (OLED) including subpixels, a gate driver and a sensing circuit. The subpixels include first subpixels having driving transistors of a first configuration and second subpixels having driving transistors of a second configuration different from the first configuration. The gate driver transmits scan line signals to first blocks and second blocks. Each of the first blocks comprising at least two of the first subpixels but none of the second subpixels. Each of the second blocks comprising at least two of the second subpixels but none of the first subpixels. The sensing circuit receives a combined sensing signal via a signal path connected to at least one of a first block and a second block, the combined sensing signal generated by combining sensing signals through the signal path shared by entire first subpixels in the first block or entire second subpixels in the second subpixel, each of the sensing signals representing a property of each of the first subpixels in the first block or each of the second subpixels in the second block.

In one embodiment, the first configuration and the second configuration are symmetric.

In one embodiment, the first blocks and the second blocks share the signal path to the sensing circuit.

In one embodiment, the first block is disposed at an upper side of the second block.

In one embodiment, the collective sensing signal of the first block is received at a first time via the signal path, and another collective sensing signal of the second block is received at a second time subsequent to the first time via the signal path.

In one embodiment, the first block is disposed on a left side of the second block.

In one embodiment, a channel length of the first subpixels is longer than a corresponding channel length of the second subpixels.

In one embodiment, the sensing signals are based on current received from each of the first subpixels in the first block or each of the second subpixels in the second block.

In one embodiment, the OLED further includes a data modulator configured to modulate data to be written to each of the first subpixels in the first block or each of the second subpixels in the second block based on the combined sensing signal.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Reference will now be made in detail to embodiments of the invention, examples of which are illustrated in the accompanying drawings. Wherever possible, the same reference numbers will be used throughout the drawings to refer to the same or like parts. It will be paid attention that detailed description of known arts will be omitted if it is determined that the arts can mislead the embodiments of the invention.

In the following description, a block includes two or more subpixels, which are simultaneously sensed, and may be construed as a set or a group.

An external compensation system of an organic light emitting diode (OLED) display according to an exemplary embodiment of the invention is classified into an external compensation system before shipment and an external compensation system after shipment.

Figure 1:
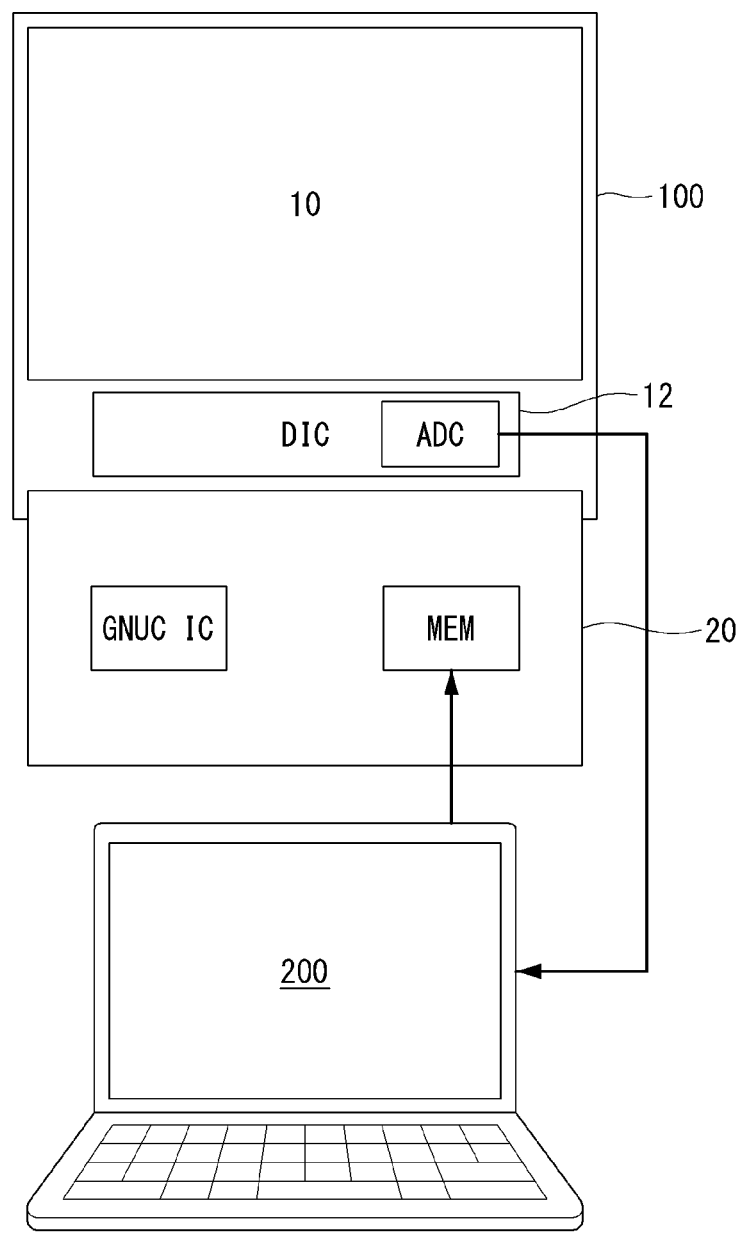
FIG. 1 illustrates an external compensation system before shipment.

FIG. 1 illustrates an external compensation system before shipment. An external compensation system before shipment includes a display module 100, a data modulator 20, and a computer 200.

Figure 4:
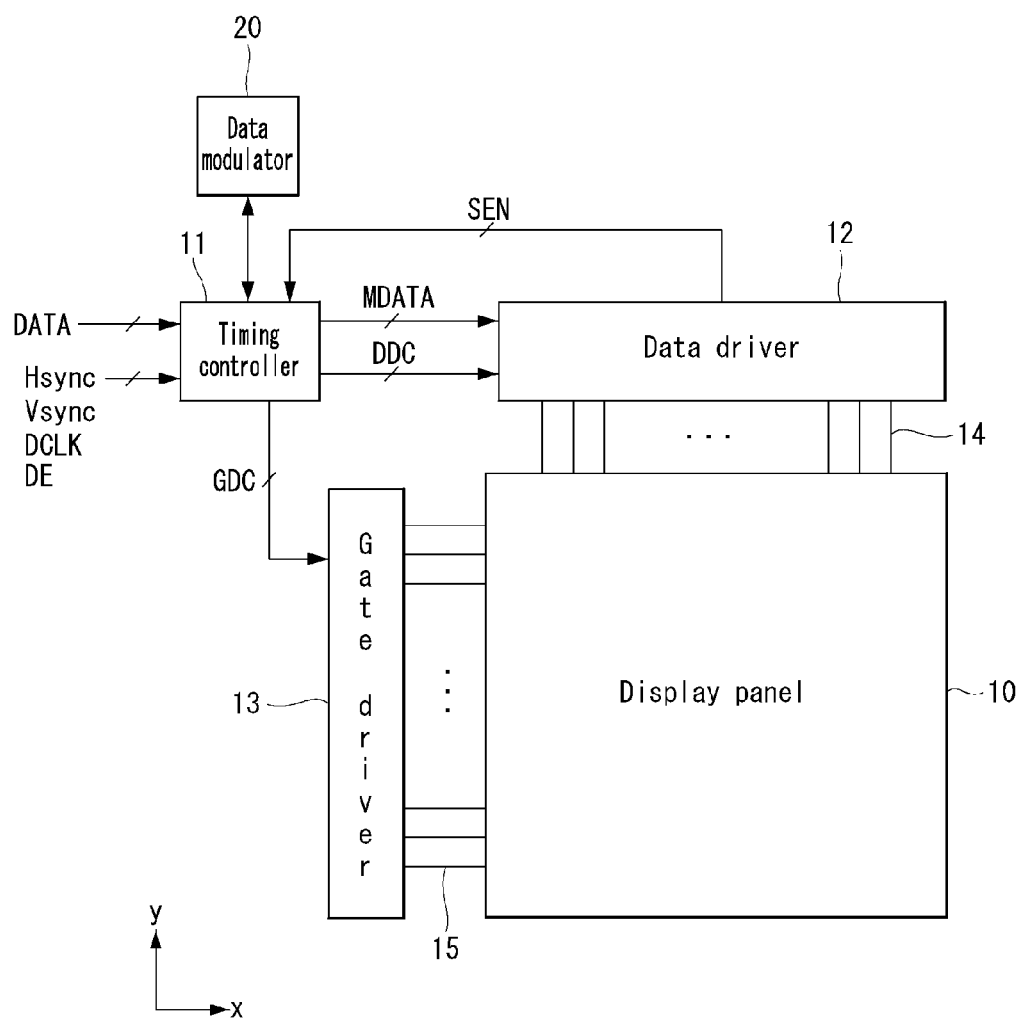
FIG. 4 is a block diagram of an organic light emitting diode (OLED) display according to an exemplary embodiment of the invention.

The display module 100 includes a display panel 10, on which a pixel array is formed, a display panel driving circuit, and the like. The embodiment of the invention senses driving properties (or characteristics) of subpixels using a multipixel sensing method for simultaneously sensing the subpixels on a per block basis. For this purpose, the embodiment of the invention prepares a sensing path, which is shared by two or more subpixels, on the pixel array of the display panel 10. The display panel driving circuit includes a data driver 12, a gate driver 13, a timing controller 11, etc. as shown in FIG. 4. The data driver 12 may be integrated into a drive integrated circuit (hereinafter, abbreviated to "DIC"). An analog-to-digital converter (ADC) outputting a sensing value using digital data may be embedded in the data driver 12.

The data modulator 20 includes a memory MEM and a compensator GNUCIC. The memory MEM stores a compensation value of each block received from the computer 200.

The display panel driving circuit supplies a sensing data voltage, which is previously set at each gray level, to the subpixels under the control of the computer 200. Currents flowing in the subpixels, to which the sensing data voltage is supplied, are added through the sensing path, which the adjacent subpixels share with each other, and are converted into digital data. The multipixel sensing method according to the embodiment of the invention simultaneously senses the subpixels included in each block through the sensing path commonly connected to the subpixels.

The computer 200 receives a sensing value of each block through the sensing path and collects the sensing values of the blocks at each gray level. The computer 200 calculates I-V transfer characteristic of each block and obtains an average I-V transfer curve of the blocks. The computer 200 stores parameters determining the average I-V transfer curve of the subpixels in the memory MEM of the data modulator 20. Further, the computer 200 analyzes the sensing values of the blocks at each gray level and calculates the I-V transfer characteristic of each block. The computer 200 stores a compensation value of each block, which minimizes a difference between the I-V transfer characteristic of each block and the average I-V transfer curve of the blocks, in the memory MEM of the data modulator 20. The memory MEM may be a flash memory.

The data modulator 20, in which the average I-V transfer curve representing driving properties of the display panel 10 is stored in the memory MEM, is transferred to a consumer after shipment in a state where the data modulator 20 is mounted on the display module 100. The display module 100 is separated from the computer 200 and is connected to a host system 200 by a manufacturer of the host system 200. The host system 200 may be one of a television system, a set-top box, a navigation system, a DVD player, a Blu-ray player, a personal computer (PC), a home theater system, and a phone system. In the phone system, the host system 200 includes an application processor (AP).

Figure 2:
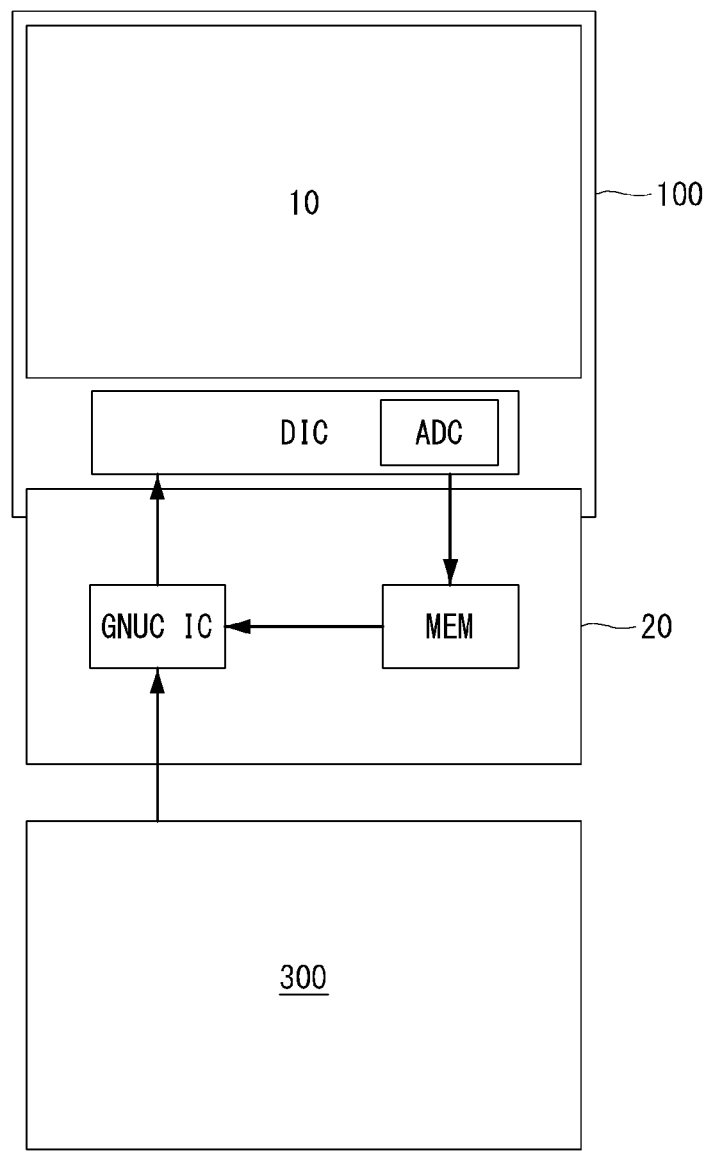
FIG. 2 illustrates an external compensation system after shipment.

As shown in FIG. 2, an external compensation system after shipment includes the display module 100 and a host system 300. When the display module 100 is driven, the compensator GNUCIC of the data modulator 20 modulates input image data to a compensation value of each block and transmits the compensation value of each block to the DIC. Thus, data, for which a variation in the driving properties of the blocks is compensated, is written to the subpixels. The external compensation system after shipment may drive the sensing path during a drive of the external compensation system and may update the sensing value of each block and the compensation value of each block, so as to compensate for the degradation (for example, changes in the driving properties over time) of the driving properties of the subpixels based on use time of the display panel 10 in accordance with applied products.

Figure 3A:
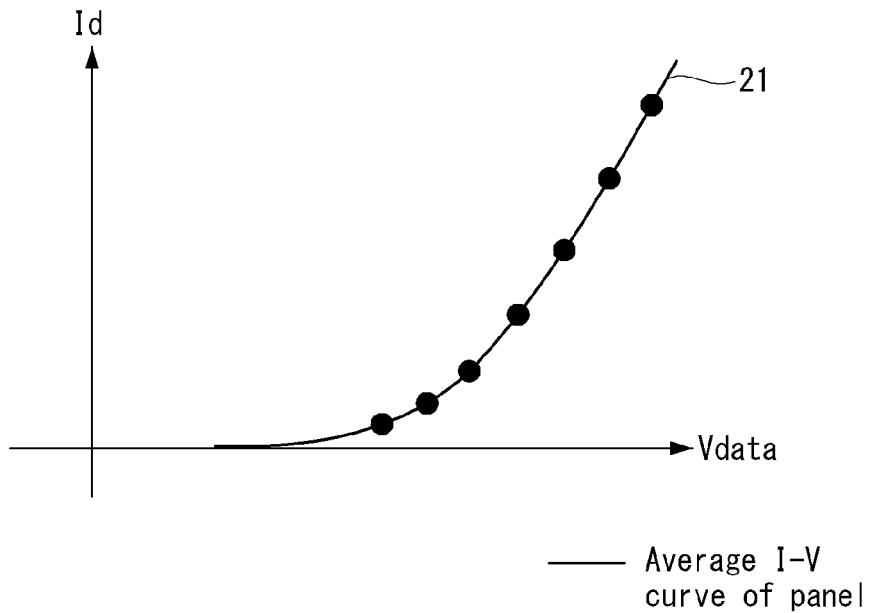
FIGS. 3A to 3C illustrate a principle of an external compensation method according to an exemplary embodiment of the invention.
Figure 3B:
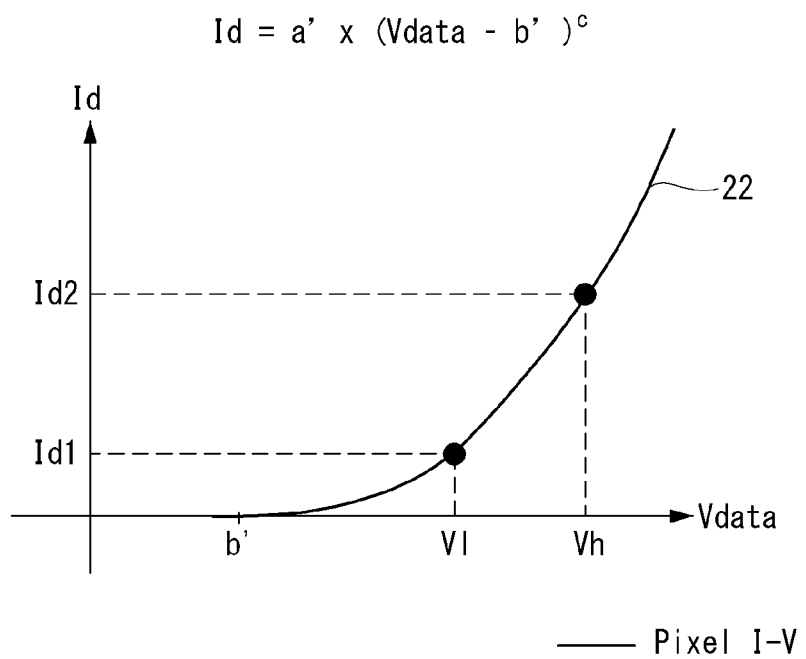
Figure 3C:
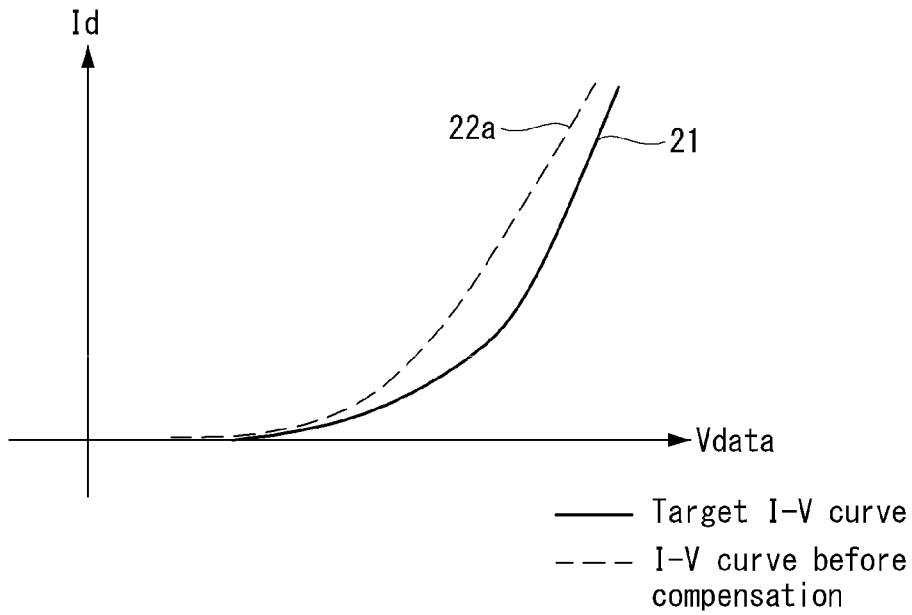
Figure 3C:
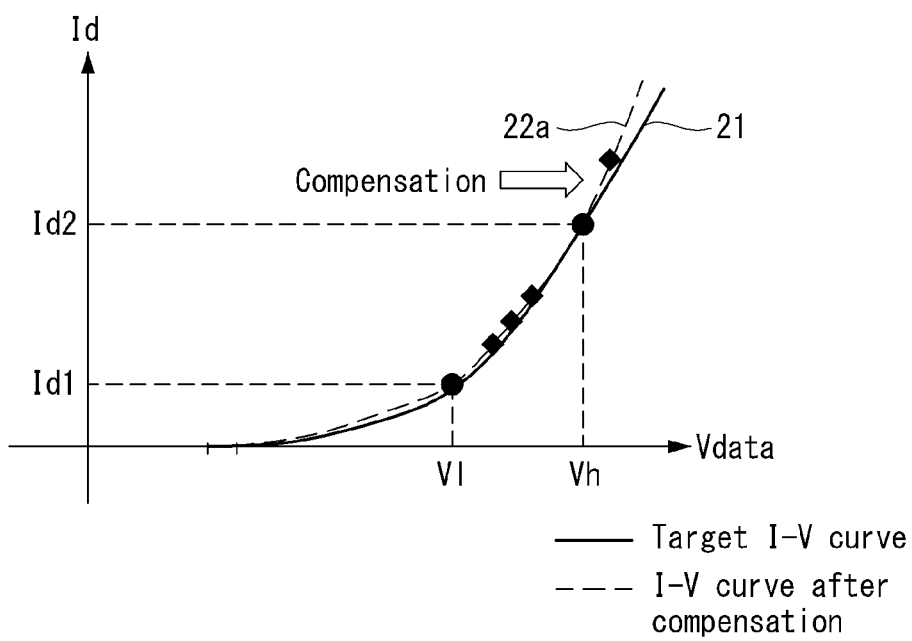

FIGS. 3A to 3C illustrate a principle of an external compensation method according to the embodiment of the invention. The external compensation method according to the embodiment of the invention simultaneously senses subpixels included in each block through one sensing path using the multipixel sensing method. The external compensation method according to the embodiment of the invention applies a plurality of gray level voltages (i.e., sensing voltages) having equal intervals to the subpixels and measures currents of the subpixels on a per block basis, thereby calculating the driving properties of the subpixels on a per block basis. For example, the driving properties of the subpixels at each of seven gray levels can be measured on a per block basis. Remaining gray levels except the really measured gray levels are calculated based on an approximate expression. Thus, the embodiment of the invention obtains an I-V transfer curve of each block using a real measurement method and an approximately calculating method.

The external compensation method according to the embodiment of the invention adds the driving properties of the blocks and divides an adding value by the number of blocks, thereby obtaining the average I-V transfer curve representing the driving properties of the display panel. An average I-V transfer curve 21 shown in FIG. 3A is stored in the memory MEM. In FIG. 3A, x-axis is a data voltage Vdata applied to a gate of a driving thin film transistor (TFT), and y-axis is a drain current Id of the driving TFT based on the data voltage Vdata.

The external compensation method according to the embodiment of the invention can compensate for a variation in the driving properties of the blocks after shipment based on the sensing value of each block obtained before shipment. When the OLED display after shipment is normally driven depending on applied fields, changes in driving property of each subpixel can be updated in each sensing period.

As shown in FIG. 3B, the external compensation method according to the embodiment of the invention applies a low gray level voltage V1 and a high gray level voltage Vh to gates of the driving TFTs of the subpixels and senses a current I of the block at a low gray level and a high gray level, so as to measure the driving properties of the subpixels at each gray level. The current of the block indicates a sum of currents flowing in the subpixels which share the sensing path with each other and are simultaneously sensed on a per block basis. If the driving property of each subpixel is sensed using the same method as an existing external compensation method, the current of the subpixel at the low gray level cannot be sensed because the current of the subpixel at the low gray level is too low. Hence, a transfer curve 22 shown in FIG. 3B cannot be obtained.

The external compensation method according to the embodiment of the invention obtains an I-V transfer curve with respect to all of the gray levels based on a low gray level sensing value and a high gray level sensing value sensed on a per block basis. In other words, the external compensation method according to the embodiment of the invention simultaneously senses the subpixels, which share the sensing path with each other, on a per block basis and senses a low gray level current using a sum of currents flowing in the subpixels included in each block. Therefore, the external compensation method according to the embodiment of the invention can sense the driving property of the subpixel at the low gray level even if a current of one subpixel at the low gray level is low.

According to the external compensation method according to the embodiment of the invention, because the subpixels included in each block share the same sensing path with each other, the driving properties of the subpixels included in each block are sensed as one value at the same gray level. The compensation value is determined as a value minimizing a difference between the I-V transfer curve of each block obtained based on the sensing value of each block and the average I-V transfer curve of the display panel.

Thus, because each block has one sensing value, the subpixels belonging to each block are compensated using the same compensation value.

The compensation value includes parameters a, b, and c in Equation (Id=a'×(Vdata−b')C) shown in FIG. 3B. In FIG. 3B, Vdata is the sensing data voltage applied to the gate of the driving TFT, c is a constant, a' is a gain value, and b' is an offset value. The method of compensating for the subpixels on a per block basis is less accurate than a method of independently compensating for each of the subpixels. However, in case of a high resolution subpixel array, there is no difference between the two methods in the image quality a user feels with the naked eye.

The parameters a, b, and c defining the transfer curve of FIG. 3C in each block are obtained based on the result of sensing each block. Data to be written to subpixels of a block sensed by the driving property different from the average I-V transfer curve of the display panel 10, is modulated to a gain value 'a' and an offset value V. Hence, the block is compensated so that its driving property accords with the average I-V transfer curve (target I-V curve) of the display panel 10. In FIGS. 3B and 3C, a Target I-V curve 21 indicates the average I-V transfer curve of the display panel, and an I-V transfer curve 22a before and after the compensation indicates the driving property (I-V transfer curve) of each block calculated based on the sensing value of each block obtained using the multipixel sensing method according to the embodiment of the invention.

According to the result of an experiment comparing the multipixel sensing method with a related art single sensing method for individually sensing subpixels, the present inventors confirmed that there was scarcely difference between compensation effects of the two methods the user feels with the naked eye. When the resolution further increases to UHD (ultra high-definition), QHD (quad high definition), etc., it is difficult for the user to perceive a difference between compensation effects of the multipixel sensing method and the single sensing method with the naked eye. FIG. 4 is a block diagram of the OLED display according to the embodiment of the invention. Referring to FIG. 4, the OLED display according to the embodiment of the invention includes the display panel 10 and the display panel driving circuit. The display panel driving circuit includes the data driver 12, the gate driver 13, the timing controller 11, etc. and writes data of an input image to the subpixels.

On the display panel 10, a plurality of data lines 14 and a plurality of gate lines 15 cross each other, and pixels are arranged in a matrix form. Data of an input image is displayed on the pixel array of the display panel 10. The display panel 10 includes reference voltage lines (hereinafter referred to as "REF lines") commonly connected to the adjacent pixels and high potential driving voltage lines (hereinafter referred to as "VDD lines") used to supply a high potential driving voltage VDD to the subpixels. A predetermined reference voltage REF (refer to FIGS. 5 and 7) is supplied to the subpixels through REF lines 16 (refer to FIGS. 5 and 6).

The gate lines 15 include a plurality of first scan lines supplied with a first scan pulse is supplied, and a plurality of second scan lines supplied with a second scan pulse. In FIGS. 6 through 12, S1 denotes the first scan pulse, and S2 denotes the second scan pulse.

Each pixel includes a red subpixel, a green subpixel, and a blue subpixel for the color representation. Each pixel may further include a white subpixel. Each subpixel is connected to one data line, one pair of gate lines, one REF line, one VOD line, and the like. The pair of gate lines includes one first scan line and one second scan line.

The embodiment of the invention simultaneously senses subpixels, which share a sensing path with each other, on a per block basis. Each block includes the subpixels sharing the sensing path with each other. Each block is not limited to adjacent subpixels sharing the sensing path. For example, each block may include subpixels which share the sensing path with each other and are separated from each other by a predetermined distance.

The multipixel sensing method according to the embodiment of the invention simultaneously senses driving properties of two or more subpixels included in each block on a per block basis. The driving properties of the subpixels included in the same block are sensed as one value. Because the embodiment of the invention has one sensing value with respect to each block, the embodiment of the invention selects one compensation value based on the one sensing value. Thus, the embodiment of the invention senses the driving properties of the subpixels included in each block as one sensing value and modulates data to be written to the subpixels of each block to the same compensation value calculated based on the sensing value.

In the OLED display according to the embodiment of the invention, a capacity of the memory, in which the sensing values are stored, is greatly reduced compared to a memory capacity in the related art single sensing method. This is because the embodiment of the invention individually detects the sensing value not from all of the subpixels but from the blocks each including two or more subpixels.

As shown in FIGS. 5 to 7 and 9, the sensing path includes the REF line 16 connected to the adjacent subpixels. The sensing path includes a sample and hold circuit SH and an ADC. The embodiment of the invention simultaneously senses subpixels sharing the sensing path on a per block basis and senses a current of each block using a sum of currents flowing in the subpixels of each block, thereby stably sensing the driving properties of the subpixels at a low gray level.

In the related art single sensing method, because currents of the subpixels are individually sensed, the subpixel has a small sensing current at a low gray level. When the subpixels sharing the REF line are individually sensed, the sensing current at the low gray level is small. Therefore, if a length of a sensing period does not sufficiently increase, the driving property of the subpixel at the low gray level cannot be sensed. On the other hand, the embodiment of the invention simultaneously senses a plurality of subpixels through the same sensing path and senses driving properties of the subpixels using a sum of currents flowing in the subpixels, thereby sensing the driving properties of the subpixels at the low gray level. Thus, the embodiment of the invention can sense the driving properties of the subpixels beyond a range of the ADC by increasing the sensing current. The embodiment of the invention can stably sense driving properties of high-resolution and high-definition subpixels requiring a low current even at the low gray level by increasing the sensing current.

The data driver 12 converts sensing data received from the computer 200 before shipment into the data voltage and supplies the data voltage to the data lines 14. Because the current is generated in the subpixels supplied with the sensing data voltage, the driving properties of the subpixels can be sensed at each of gray levels, which are previously set before shipment.

In case of a display device for individually sensing changes in the driving properties of the blocks over time after shipment, the data driver 12 converts sensing data received from the timing controller 11 into the data voltage and supplies the data voltage to the data lines 14 under the control of the timing controller 11 in each sensing period, which is previously set in a normal drive. The sensing period is arranged between frame periods and may be assigned as a blank period (i.e., a vertical blank period), in which data of the input image is not received. The sensing period may include a predetermined period immediately after the display device is turned on or immediately after the display device is turned off.

The sensing periods set before and after shipment are divided into a sampling period of the sample and hold circuit SH, a sensing data writing period, and a sensing data reading period. The sensing period is controlled by the timing controller 11 shown in FIG. 4.

When the driving property of the subpixel is sensed in each sensing period, the sensing value of each block stored in the memory MEM is updated to a value, to which a degradation degree of the driving property of the subpixel over time is reflected. Such a compensation method may be applied to applied products having long life span, for example, television.

The variation in the driving properties of the subpixels is compensated using the sensing value measured before shipment, and a separate sensing period after shipment cannot be secured. In this instance, the changes in driving properties of the subpixels over time while the consumer uses after shipment are not reflected. Such a compensation method may be applied to applied products (for example, mobile devices or wearable devices), which is used for a short period of time.

The sensing data voltage is applied to gates of the driving TFTs of the subpixels during the sensing period. The sensing data voltage causes the driving TFT to be turned on during the sensing period and causes current to flow in the driving TFT. The sensing data voltage is generated as a previously set gray value. The sensing data voltage varies depending on a previously set sensing gray level.

The computer 200 or the timing controller 11 transmits sensing data SDATA (refer to FIGS. 8 and 10), which is previously stored in an internal memory during the sensing period, to the data driver 12. The sensing data SDATA is previously determined irrespective of data of the input image and is used to sense the driving properties of the subpixels on a per block basis. The data driver 12 converts the sensing data SDATA received as digital data into a gamma compensation voltage through a digital-to-analog converter (DAC) and outputs the sensing data voltage to the data lines 14. The data driver 12 converts a sensing voltage of each block, which is obtained when the sensing data voltage is supplied to the subpixels, into digital data through the ADC. The data driver 12 transmits a sensing value SEN output to the ADC to the timing controller 11. The sensing voltage of each block is proportional to a sum of currents flowing in the subpixels belonging to each block generated when the sensing data voltage is supplied to the subpixels.

The data driver 12 converts digital video data MDATA of the input image received from the timing controller 11 into the data voltage through the DAC during a normal driving period, in which the input image is displayed, and then supplies the data voltage to the data lines 14. The digital video data MDATA supplied to the data driver 12 is data modulated by the data modulator 20, so as to compensate for changes in the driving property of the subpixel based on the result of sensing the driving property of the subpixel.

Circuit elements connected to the sensing path may be embedded in the data driver 12. For example, the data driver 12 may include the sample & holder SH, the ADC, and switching elements MR, MS, M1, and M2 in FIGS. 7 and 9.

Figure 8:
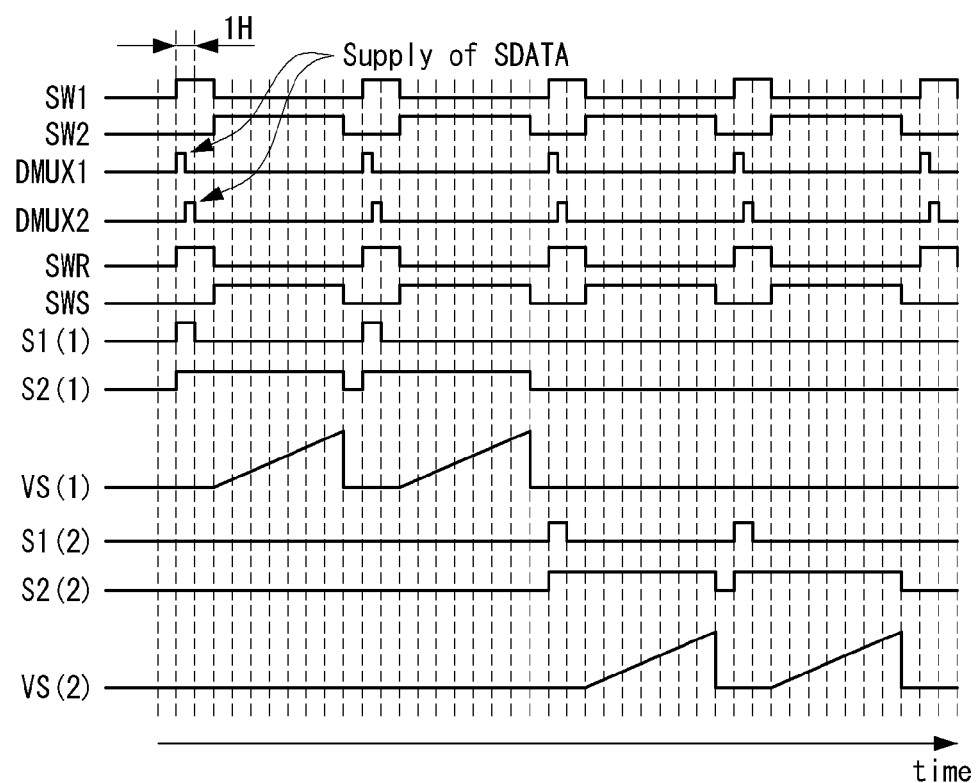
FIG. 8 is a waveform diagram showing a method for controlling subpixels and a sensing path shown in FIG. 7.
Figure 10:
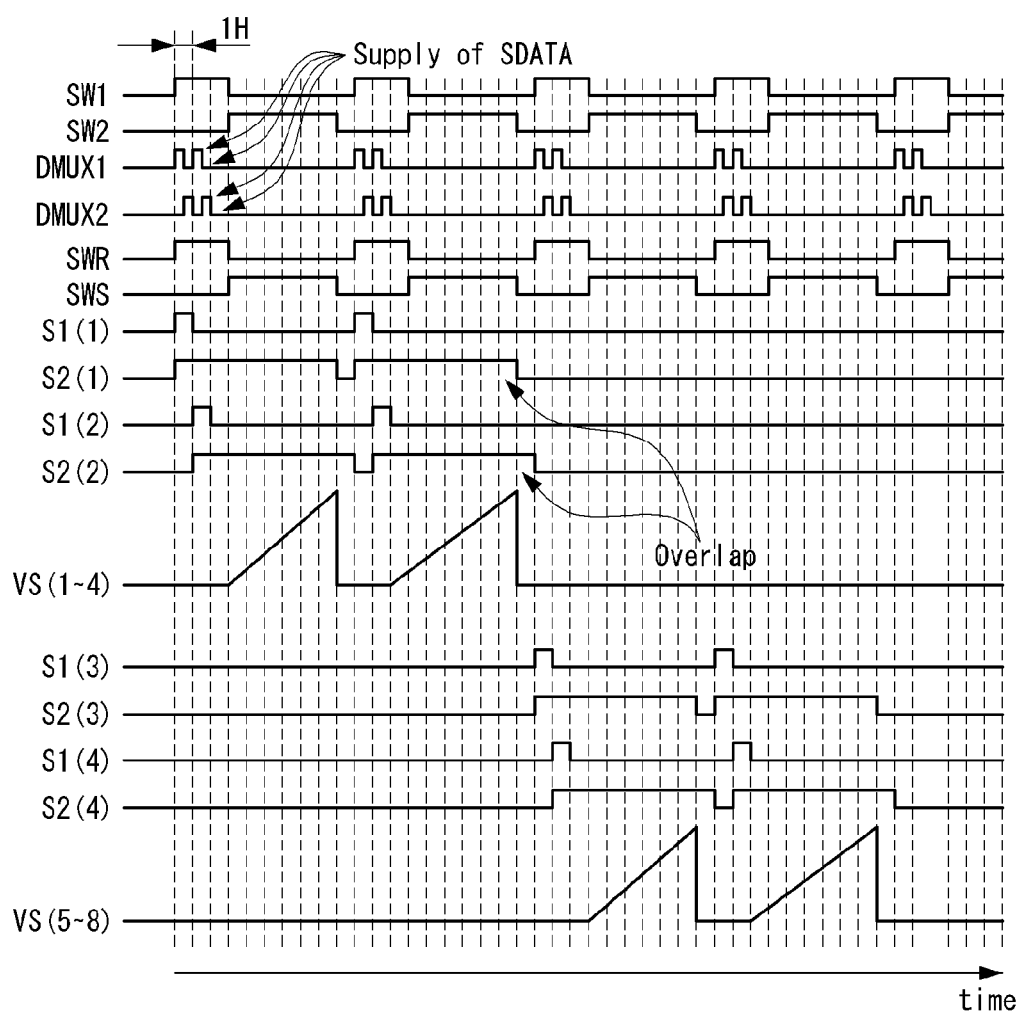
FIG. 10 is a waveform diagram showing a method for controlling subpixels and a sensing path shown in FIG. 9.

The gate driver 13 generates the scan pulses S1 and S2 shown in FIGS. 8 and 10 under the control of the timing controller 11 and supplies the scan pulses S1 and S2 to the gate lines 15. The gate driver 13 shifts the scan pulses S1 and S2 using a shift register and thus can sequentially supply the scan pulses S1 and S2 to the gate lines 15. The shift register of the gate driver 13 may be directly formed on a substrate of the display panel 10 along with the pixel array of the display panel 10 through a GIP (Gate-driver In Panel) process.

The timing controller 11 receives digital video data DATA of the input image and a timing signal synchronized with the digital video data DATA from the host system 300. The timing signal includes a vertical sync signal Vsync, a horizontal sync signal Hsync, a clock signal DCLK, a data enable signal DE, and the like.

The timing controller 11 generates a data timing control signal DDC for controlling operation timing of the data driver 12 and a gate timing control signal GDC for controlling operation timing of the gate driver 13 based on the timing signal received from the host system 300. The timing controller 11 supplies the sensing value SEN received from the data driver 12 to the data modulator 20 and transmits the digital video data MDATA modulated by the data modulator 20 to the data driver 12.

The gate timing control signal GDC includes a start pulse, a shift clock, and the like. The start pulse defines start timing, which causes a first output to be generated in the shift register of the gate driver 13. The shift register starts to be driven when the start pulse is input, and outputs a first gate pulse at first clock timing. The shift clock controls output shift timing of the shift register.

The data modulator 20 selects a previously set compensation value based on the sensing value SEN of each block. The data modulator 20 modulates data of the input image, which will be written to the subpixels included in each block, using the selected compensation value of each block. The compensation value includes an offset value 'b' for compensating for changes in a threshold voltage of the driving TFT and a gain value 'a' for compensating for changes in mobility of the driving TFT. The offset value 'b' is added to the digital video data DATA of the input image and compensates for changes in the threshold voltage of the driving TFT. The gain value 'a' is multiplied by the digital video data DATA of the input image and compensates for changes in the mobility of the driving TFT. Because the sensing value is obtained on a per block basis, the data modulator 20 applies the same compensation value to data, which will be written to the subpixels belonging to each block, and modulates the data. Parameters required to calculate the average transfer curve, the offset value, and the gain value of the display panel are stored in a memory of the data modulator 20. The data modulator 20 may be embedded in the timing controller 11.

Figure 5:
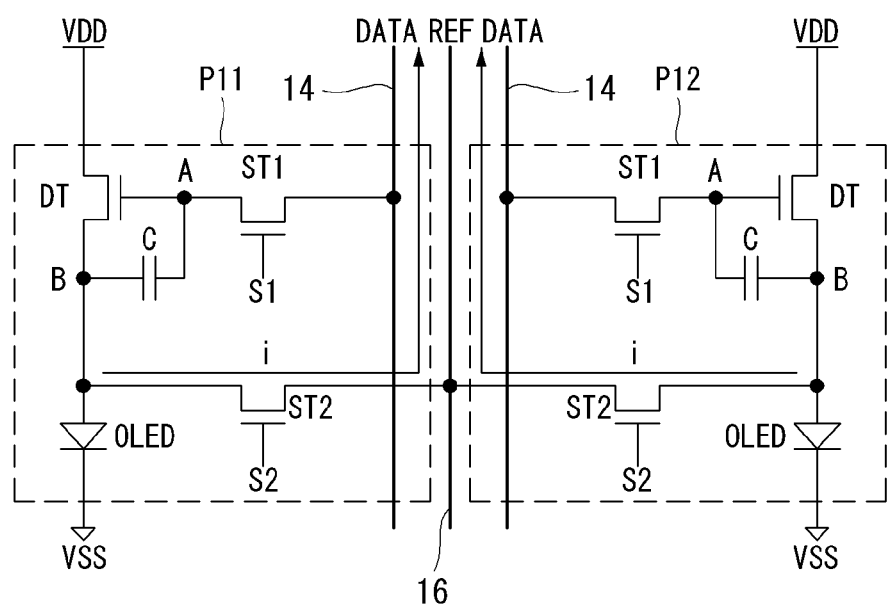
FIG. 5 is a circuit diagram showing a multipixel sensing method according to a first embodiment of the invention.

FIG. 5 is a circuit diagram showing a multipixel sensing method according to a first embodiment of the invention. Referring to FIG. 5, the multipixel sensing method according to the first embodiment of the invention simultaneously senses two subpixels P11 and P12 sharing a sensing path with each other. The first embodiment of the invention describes that the subpixels, which are horizontally positioned adjacent to each other, are simultaneously sensed, as an example. In addition, the simultaneously sensed subpixels may be separated from one another.

Each of the subpixels P11 and P12 includes an OLED, a driving TFT DT, first and second switching TFTs ST1 and ST2, and a storage capacitor C. A pixel circuit is not limited to FIG. 5.

The OLED includes an organic compound layer formed between an anode and a cathode. The organic compound layer may include a hole injection layer HIL, a hole transport layer HTL, an emission layer EML, an electron transport layer ETL, an electron injection layer EIL, etc., but is not limited thereto.

FIG. 5 shows that an n-type metal-oxide semiconductor field-effect transistor (MOSFET) is used as an example of the TFTs ST1, ST2, and DT. In the first embodiment of the invention, a p-type MOSFET may be used. The TFTs ST1, ST2, and DT may be implemented by one of an amorphous silicon (a-Si) TFT, a polysilicon TFT, and an oxide semiconductor TFT, or a combination thereof.

The anode of the OLED is connected to the driving TFT DT via a second node B. The cathode of the OLED is connected to a ground level voltage source and is supplied with a ground level voltage VSS.

The driving TFT DT controls a current Ioled flowing in the OLED depending on a gate-to-source voltage Vgs of the driving TFT DT. The driving TFT DT includes a gate connected to a first node A, a drain supplied with a high potential driving voltage VDD, and a source connected to the second node B. The storage capacitor C is connected between the first node A and the second node B and holds the gate-to-source voltage Vgs of the driving TFT DT.

The first switching TFT ST1 applies the data voltage Vdata from the data line 14 to the first node A in response to the first scan pulse S1. The first switching TFT ST1 includes a gate supplied with the first scan pulse S1, a drain connected to the data line 14, and a source connected to the first node A.

The second switching TFT ST2 switches on or off a current path between the second node B and the REF line 16 in response to the second scan pulse S2. The second switching TFT ST2 includes a gate supplied with the second scan pulse S2, a drain connected to the second node B, and a source connected to the REF line 16.

The adjacent subpixels P11 and P12 positioned on the left and right sides of the REF line 16 share a sensing path including the REF line 16 with each other and are simultaneously sensed during a sensing period. Because an amount of current "i" flowing through the REF line 16 is about two times larger than that in the single sensing method, the first embodiment of the invention can sense driving properties of the subpixels P11 and P12 at a low gray level below a lower range of the ADC.

Figure 6:
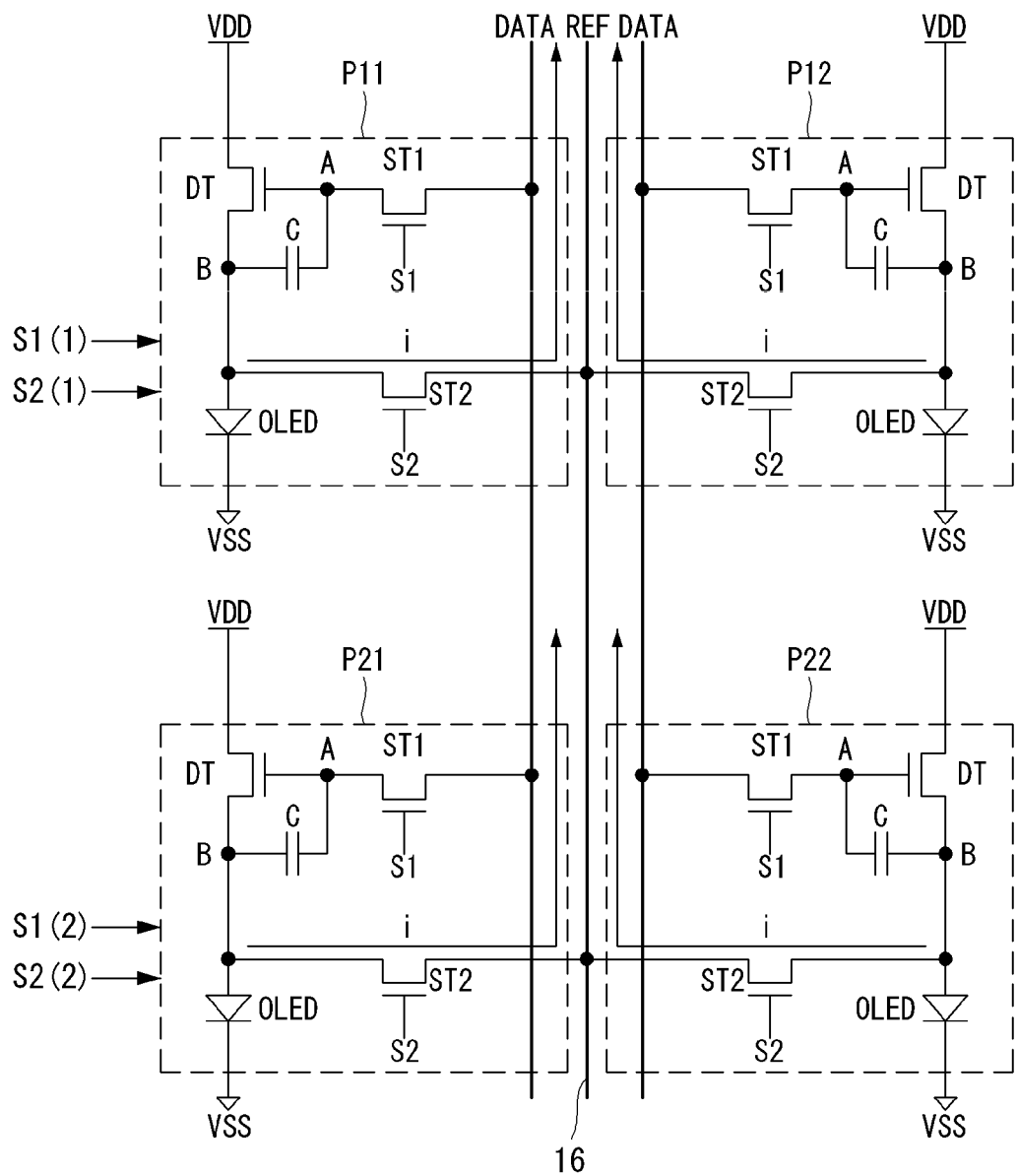
FIG. 6 is a circuit diagram showing a multipixel sensing method according to a second embodiment of the invention.

FIG. 6 is a circuit diagram showing a multipixel sensing method according to a second embodiment of the invention. Referring to FIG. 6, the multipixel sensing method according to the second embodiment of the invention simultaneously senses four subpixels P11, P12, P21, and P22 sharing a sensing path with one another. The first and second subpixels P11 and P12 disposed on an Nth line of a pixel array and the third and fourth subpixels P21 and P22 disposed on an (N+1)th line of the pixel array are horizontally and vertically adjacent to one another and share a sensing path including the REF line 16 with one another, where N is a positive integer.

The second embodiment of the invention describes that the subpixels, which are horizontally and vertically positioned adjacent to one another, are simultaneously sensed. In other embodiments, the simultaneously sensed subpixels may be separated from one another instead of being adjacent to each other. Since a structure of each of the subpixels P11, P12, P21, and P22 is substantially the same as the first embodiment of the invention illustrated in FIG. 5, a further description may be briefly made or may be entirely omitted. The subpixels P11, P12, P21, and P22 sharing the sensing path including the REF line 16 are simultaneously sensed during a sensing period. Because an amount of current flowing through the REF line 16 is about four times larger than that in the single sensing method, the second embodiment of the invention can sense driving properties of the subpixels P11, P12, P21, and P22 at a low gray level below a lower range of the ADC.

Figure 7:
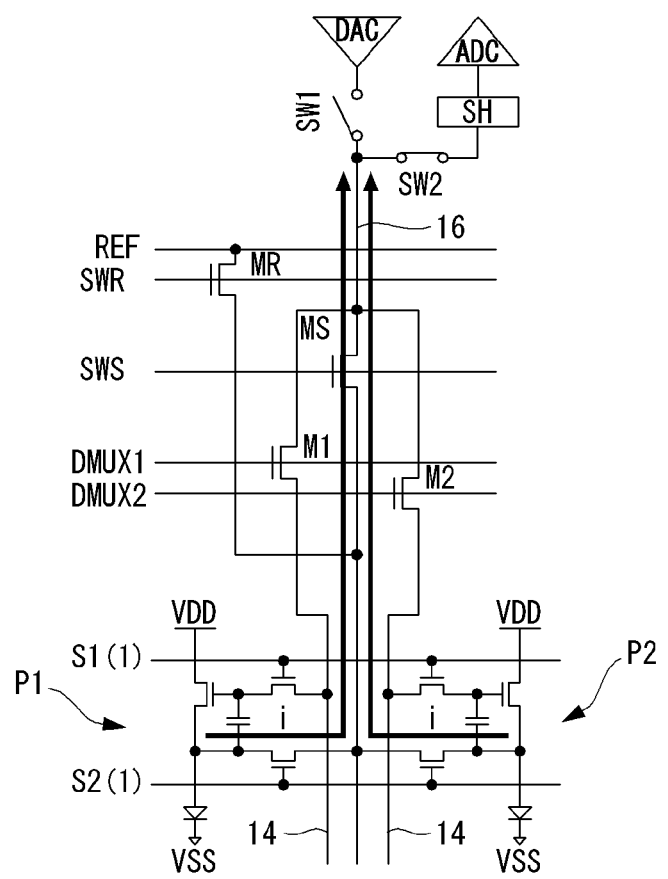
FIG. 7 is a circuit diagram showing a sensing path in a multipixel sensing method shown in FIG. 5, according to one embodiment.

FIG. 7 is a circuit diagram showing a sensing path in the multipixel sensing method shown in FIG. 5. FIG. 8 is a waveform diagram showing a method for controlling subpixels and a sensing path shown in FIG. 7. FIGS. 7 and 8 illustrate that two subpixels are simultaneously sensed as shown in FIG. 5, as an example.

Referring to FIGS. 7 and 8, the OLED display according to the embodiment of the invention further includes demultiplexers (hereinafter abbreviated to as "DMUXs") M1 and M2 connected between the REF line 16 and the plurality of data lines 14, a first sensing switch MS connected to the REF line 16, an REF switch MR, a second sensing switch SW2 connected between the REF line 16 and the sample and hold circuit SH, an ADC connected to the sample and hold circuit SH, a data switch SW1 connected between the REF line 16 and the DAC, and the like.

During the sensing period, the sensing data voltage is supplied to subpixels P11 and P12. The sensing data SDATA may be generated as low gray level data and high gray level data. The low gray level data may be selected among low gray level data, in which 2 bits of most significant bit (MSB) are "00" in 8-bit data. The high gray level data may be selected among low gray level data, in which 2 bits of most significant bit (MSB) are "11" in 8-bit data.

During the sensing period, the DAC converts the sensing data SDATA received by the data driver 12 into an analog gamma compensation voltage and generates the sensing data voltage. During the normal driving period, the DAC converts the data MDATA of the input image received by the data driver 12 into the analog gamma compensation voltage and generates the data voltage of data to be displayed on the pixels. An output voltage of the DAC is the data voltage and is supplied to the data lines 14 through the DMUXs M1 and M2. The DAC may be embedded in the data driver 12.

During the sensing period, the sample and hold circuit SH converts a sum of currents "i" flowing in the subpixels of each block into a sensing voltage and inputs the sensing voltage to the ADC. The ADC converts the sensing voltage into digital data and outputs a sensing value SEN of each block. The sensing value SEN of each block is transmitted to the data modulator 20 through the timing controller 11. The ADC may be embedded in the data driver 12.

During the sensing period, the DMUXs M1 and M2 distribute the sensing data voltage output from the DAC to the first and second data lines 14 under the control of the timing controller 11. During the normal driving period, the DMUXs M1 and M2 distribute the data voltage of the input image output from the DAC to the first and second data lines 14 under the control of the timing controller 11. The DMUXs M1 and M2 distribute an output of the DAC to the plurality of data lines 14 and thereby reduce the number of output channels of the data driver 12. Because the output channels of the data driver 12 can be directly connected to the date lines 14, the DMUXs M1 and M2 may be omitted.

The DMUXs M1 is connected between the REF line 16 and the first data line 14 and the DMUX M2 is connected between the REF line 16 and the second data line 14. The DMUXs M1 and M2 may be embedded in the data driver 12 or may be directly formed on the display panel 10. In an example of FIG. 7, the first data line 14 is the data line 14 positioned on the left side of the REF line 16, and the second data line 14 is the data line 14 positioned on the right side of the REF line 16.

The DMUX M1 supplies the data voltage output from the DAC to the subpixel P11 through the first data line 14 in response to a first DMUX signal DMUX1. The DMUX M2 supplies the data voltage output from the DAC to the subpixel P12 through the second data line 14 in response to a second DMUX signal DMUX2.

The first sensing switch MS switches on or off the sensing path under the control of the timing controller 11. The REF switch MR switches on or off a transmission path of the reference voltage REF under the control of the timing controller 11. The transmission path of the reference voltage REF includes the REF switch MR, the REF line 16, and the second switching TFT ST2. The reference voltage REF is supplied to the second nodes B of the subpixels P11 and P12 through the transmission path of the reference voltage REF.

The REF switch MR is turned on in response to a SWR signal received from the timing controller 11. The SWR signal is synchronized with a control signal (hereinafter referred to as "SW1 signal") controlling the data switch SW1. A pulse duration of each of the SWR signal and the SW1 signal may be approximately two horizontal periods, but is not limited thereto. The SWR signal and the SW1 signal are synchronized with first scan pulses S1(1) and S1(2). The first scan pulses S1(1) and S1(2) may be generated to have a pulse width of about one horizontal period 1 H, but are not limited thereto. The first scan pulses S1(1) and S1(2) overlap the first and second DMUX signals DMUX1 and DMUX2. "S1(1)" denotes a scan pulse for turning on the first switching TFTs ST1 of the subpixels P11 and P12 arranged on the Nth line of the pixel array. "S1(2)" denotes a scan pulse for turning on the first switching TFTs ST1 of the subpixels arranged on the (N+1)th line of the pixel array.

The pulse durations of the SWR signal and the SW1 signal overlap the first DMUX signal DMUX1 and the second DMUX signal DMUX2. Each of the first and second DMUX signals DMUX1 and DMUX2 may be generated as a signal having a pulse width of ½ horizontal period, but is not limited thereto. The second DMUX signal DMUX2 is generated later than the first DMUX signal DMUX1.

Subsequent to the REF switch MR, the first sensing switch MS is turned on in response to a SWS signal received from the timing controller 11.

The SWS signal rises subsequent to the SWR signal and has a pulse duration longer than the SWR signal. The SWS signal is synchronized with a control signal (hereinafter referred to as "SW2 signal") controlling the second sensing switch SW2. Thus, the first and second sensing switches MS and SW2 are simultaneously turned on. In an example of FIG. 8, each of the SWS signal and the SW2 signal has a pulse duration of seven horizontal periods, but is not limited thereto.

Second scan pulses S2(1) and S2(2) rise at the same time as the first scan pulses S1(1) and S1(2) and fall later than the first scan pulses S1(1) and S1(2). In an example of FIG. 8, each of the second scan pulses S2(1) and S2(2) has a pulse duration of nine horizontal periods, but is not limited thereto. The pulse duration of the second scan pulses S2(1) and S2(2) overlaps the SW1 signal, the SW2 signal, the SWR signal, the SWS signal, and the first and second DMUX signals DMUX1 and DMUX2. "S2(1)" denotes a scan pulse for turning on the second switching TFTs ST2 of the subpixels P11 and P12 arranged on the Nth line of the pixel array. "S2(2)" denotes a scan pulse for turning on the second switching TFTs ST2 of the subpixels arranged on the (N+1)th line of the pixel array.

When the subpixels P11 and P12 of the Nth line are sensed, the sensing data voltage is supplied to the first nodes A of the subpixels P11 and P12, and the reference voltage REF is supplied to the second nodes B of the subpixels P11 and P12. In this instance, the sensing data voltage is supplied to the gate of the driving TFT DT of each of the subpixels P11 and P12. As a result, the current "i" starts to flow in the sensing path through the driving TFT DT.

When the first sensing switch MS and the second switch TFTs ST2 of the subpixels P11 and P12 are turned on, the current "i" of the subpixels P11 and P12 flows along the REF line 16. In this instance, the current flowing in the subpixels P11 and P12 sharing the sensing path is added to the REF line 16, and the amount of current in the REF line 16 twice the amount of current in the REF line 16 when only one subpixel is sensed. In FIG. 8, "VS(1)" denotes a sensing voltage increasing to a sum of currents flowing in the subpixels P11 and P12 of the Nth line. The sensing voltage applied to the REF line 16 is sampled by the sample & holder SH and is converted into digital data through the ADC. The sensing value SEN output from the ADC is transmitted to the timing controller 11.

After the subpixels of the Nth line are simultaneously sensed, driving properties of the subpixels of the (N+1)th line sharing the sensing path are simultaneously sensed. In FIG. 8, "VS(2)" is a sensing voltage increasing to a sum of currents flowing in the subpixels of the (N+1)th line.

Figure 9:
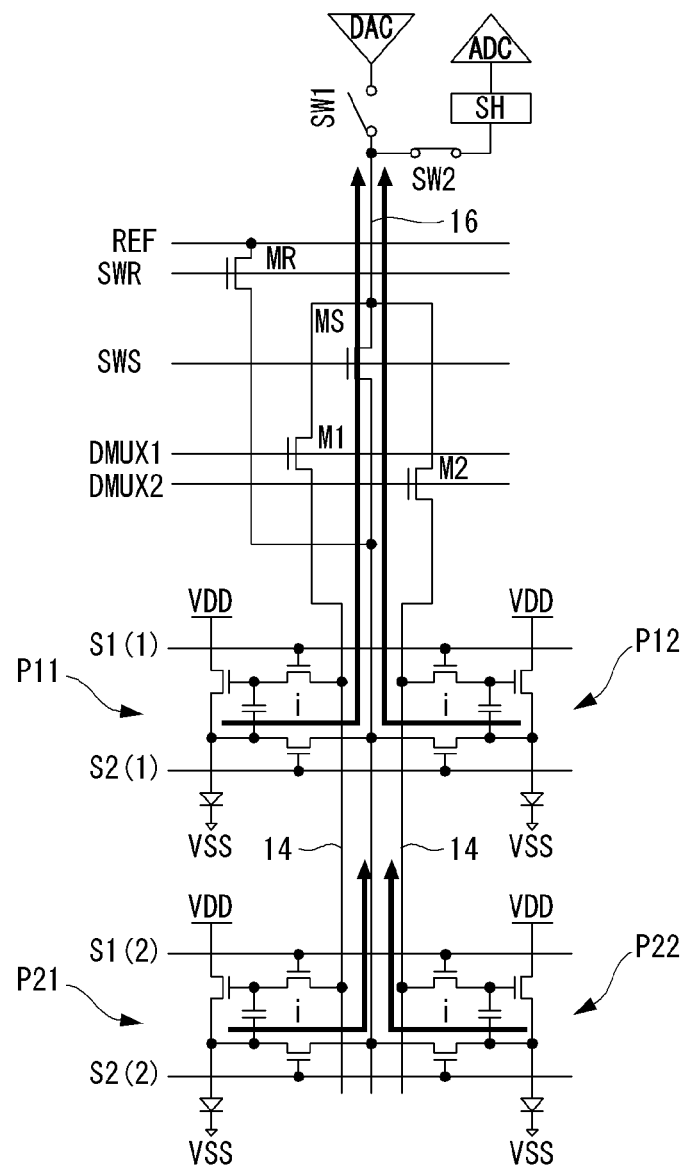
FIG. 9 is a circuit diagram showing a sensing path in a multipixel sensing method shown in FIG. 6.

FIG. 9 is a circuit diagram showing a sensing path in the multipixel sensing method shown in FIG. 6. FIG. 10 is a waveform diagram showing a method for controlling subpixels and a sensing path shown in FIG. 9. FIGS. 9 and 10 illustrate that four subpixels are simultaneously sensed as shown in FIG. 6, as an example.

Referring to FIGS. 9 and 10, the OLED display according to the embodiment of the invention further includes DMUXs M1 and M2 connected between the REF line 16 and the plurality of data lines 14, a first sensing switch MS connected to the REF line 16, an REF switch MR, a second sensing switch SW2 connected between the REF line 16 and the sample and hold circuit SH, an ADC connected to the sample and hold circuit SH, a data switch SW1 connected between the REF line 16 and the DAC, and the like.

Since the structure of the pixel array shown in FIG. 9 is substantially the same as the structure of the pixel array shown in FIG. 7, a further description may be briefly made or may be entirely omitted. As shown in FIG. 10, after the sensing data voltage is supplied to subpixels P11, P12, P21, and P22 of two lines, and second scan pulses S2(1) and S2(2) supplied to the subpixels P11, P12, P21, and P22 of the two lines overlap each other. Hence, the four subpixels P11, P12, P21, and P22 disposed on the two lines are simultaneously sensed.

First scan pulses S1(1) and S1(2) define a sensing data writing period. The second scan pulses S2(1) and S2(2) define a sensing data reading period.

Pulse durations of a SWR signal and a SW1 signal overlap a first DMUX signal DMUX1 and a second DMUX signal DMUX2. In an example of FIG. 10, each of the SWR signal and the SW1 signal is generated as a signal having a pulse width of three horizontal periods, but is not limited thereto. Each of the DMUX signals DMUX1 and DMUX2 is generated twice during the pulse duration of the SW1 signal, so that the sensing data voltage can be supplied to the four subpixels P11, P12, P21, and P22. Each of the DMUX signals DMUX1 and DMUX2 may be generated twice as a pulse of ½ horizontal period. The second DMUX signal DMUX2 is generated after the first DMUX signal DMUX1.

A SWS signal rises subsequent to the SWR signal and has a pulse duration longer than the SWR signal. The SWS signal is synchronized with a SW2 signal.

The second scan pulses S2(1) and S2(2) rise at the same time as the first scan pulses S1(1) and S1(2) and fall later than the first scan pulses S1(1) and S1(2). The pulse duration of the second scan pulses S2(1) and S2(2) overlaps the SW1 signal, the SW2 signal, the SWR signal, the SWS signal, and the first and second DMUX signals DMUX1 and DMUX2. The second scan pulses S2(1) and S2(2) overlap each other, so as to simultaneously sense the four subpixels disposed on the Nth line and the (N+1)th line. Because subpixels disposed on a plurality of lines have to be electrically connected to one another through a sensing path, which the subpixels share, so as to simultaneously sense the subpixels disposed on the plurality of lines, two or more second scan pulses S2(1) and S2(2) have to overlap each other. "S2(1)" denotes a scan pulse for turning on the second switching TFTs ST2 of the subpixels P11 and P12 arranged on the Nth line of the pixel array. "S2(2)" denotes a scan pulse for turning on the second switching TFTs ST2 of the subpixels P21 and P22 arranged on the (N+1)th line of the pixel array.

The multipixel sensing method for sensing four subpixels supplies the sensing data voltage to the first nodes A of the subpixels P11 and P12 and supplies the reference voltage REF to the second nodes B of the subpixels P11 and P12. In this instance, the sensing data voltage is supplied to the gate of the driving TFT DT of each of the subpixels P11, P12, P21, and P22 sharing the sensing path, and the current "i" starts to flow in the sensing path through the driving TFT DT.

When the first sensing switch MS and the second switch TFTs ST2 of the subpixels are turned on, the current "i" of the subpixels flows along the REF line 16. In this instance, the current flowing in the subpixels P11, P12, P21, and P22 sharing the sensing path is added to the REF line 16, and a current of the REF line 16 increases to four times a current of the REF line 16 when one subpixel is sensed. In FIG. 10, "VS(1~4)" denotes a sensing voltage increasing to a sum of currents flowing in the subpixels P11, P12, P21, and P22 of the Nth and (N+1)th lines. The sensing voltage applied to the REF line 16 is sampled by the sample & holder SH and is converted into digital data through the ADC. The sensing value SEN output from the ADC is transmitted to the timing controller 11. As described above, after the subpixels of two lines sharing the sensing path are simultaneously sensed, the subpixels of next two lines sharing the sensing path are simultaneously sensed.

After the subpixels P11, P12, P21, and P22 of the Nth and (N+1)th lines are simultaneously sensed, driving properties of subpixels of (N+2)th and (N+3)th lines (not shown) sharing a sensing path are simultaneously sensed. In FIG. 10, "VS(5~8)" denotes a sensing voltage increasing to a sum of currents flowing in four subpixels of the (N+2)th and (N+3)th lines sharing the sensing path.

Figure 11:
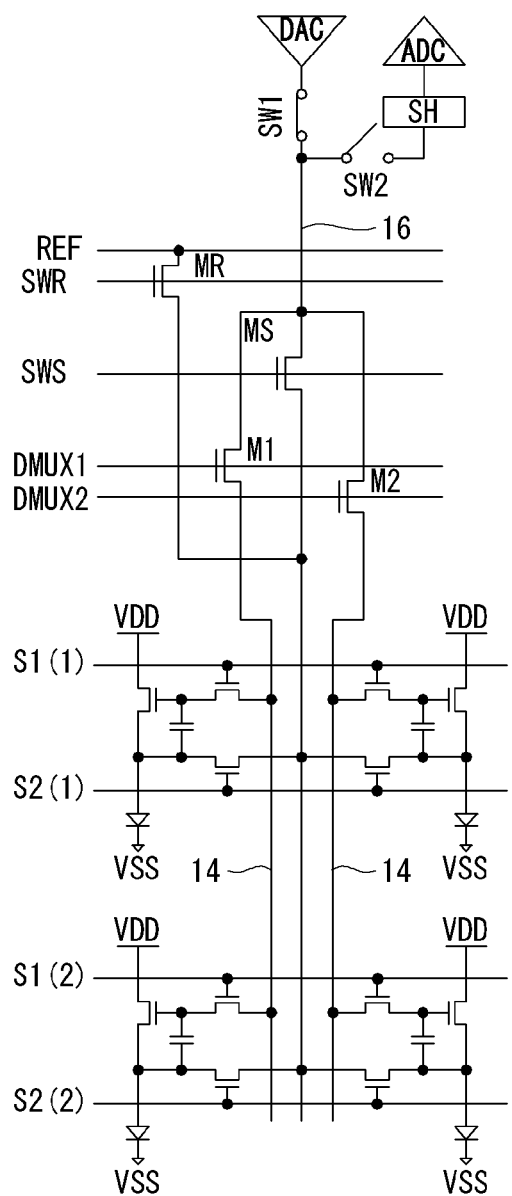
FIG. 11 is a circuit diagram showing a path, through which data of an input image is supplied to subpixels in a normal drive.
Figure 12:
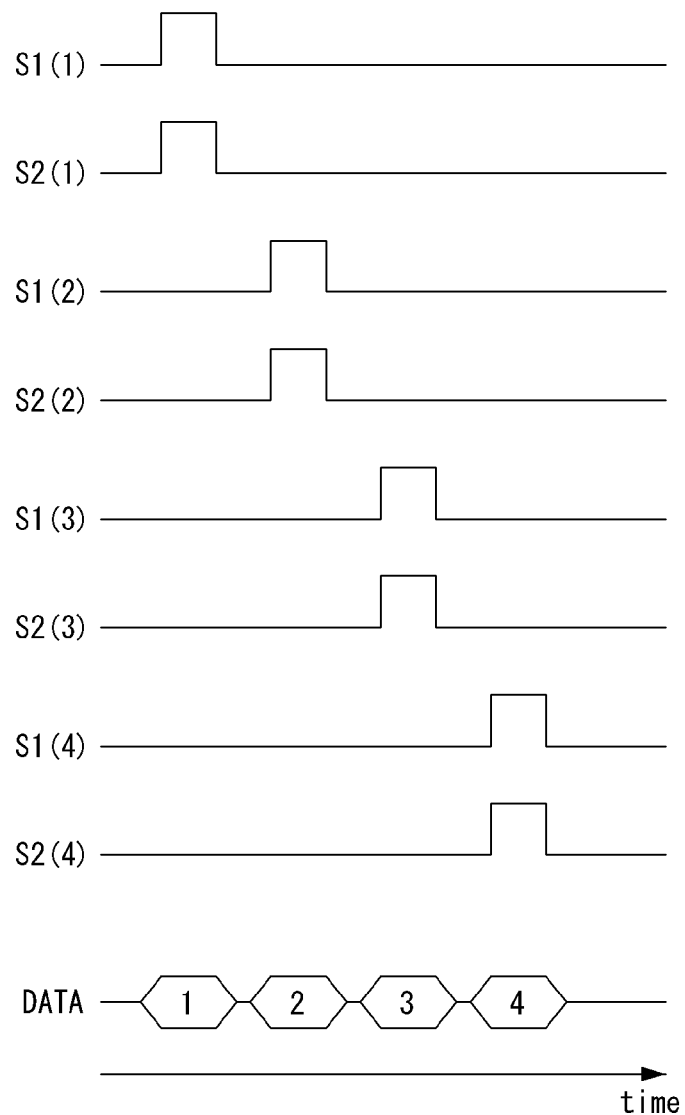
FIG. 12 is a waveform diagram showing a method for controlling subpixels and a sensing path shown in FIG. 11.

FIG. 11 is a circuit diagram showing a path, through which data of an input image is supplied to subpixels in a normal drive. FIG. 12 is a waveform diagram showing a method for controlling subpixels and a sensing path shown in FIG. 11.

Referring to FIGS. 11 and 12, data of the input image is written to the subpixels on a per line basis in a normal driving mode. For this, as shown in FIG. 11, the switching elements SW1, MS, MR, M1, and M2 are turned on and thus form a data voltage transfer path and a reference voltage path. The switching element SW2 is turned off.

First scan pulses S1(1) and S1(2) are sequentially shifted by the shift register. Second scan pulses S2(1) and S2(2) are sequentially shifted by the shift register in the same manner as the first scan pulses S1(1) and S1(2). The first scan pulse and the second scan pulse supplied to the same subpixel are synchronized with each other. In the normal driving mode, the reference voltage REF is supplied to the second node B, and the data voltage of the input image is supplied to the first node A. In FIG. 12, "DATA" is data of the input image which is synchronized with the first and second scan pulses and is written to the subpixels. In the normal driving mode, the data voltage of the input image is applied to the first node A of the subpixel, i.e., the gate of the driving TFT.

Figure 13:
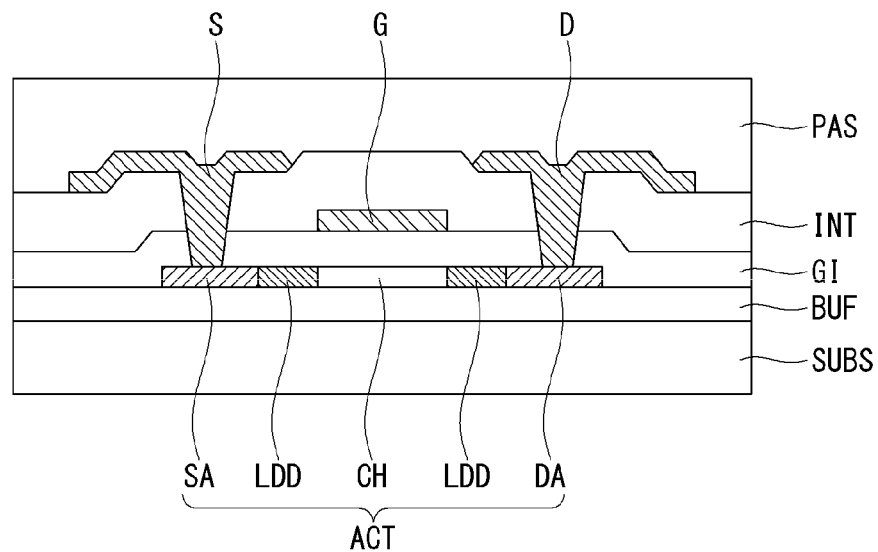
FIG. 13 is a cross-sectional view showing an example of a structure of a thin film transistor (TFT)
Figure 14:
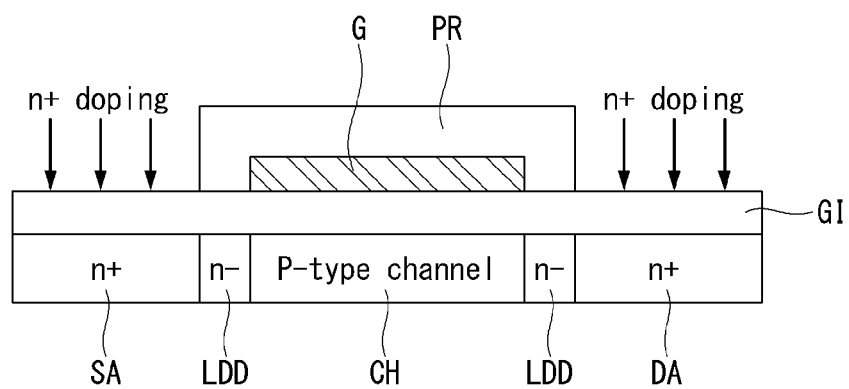
FIG. 14 is a cross-sectional view showing a process for doping a TFT with impurities.

FIG. 13 is a cross-sectional view showing an example of a structure of a TFT formed in subpixels. FIG. 14 illustrates a process for doping a semiconductor pattern. Referring to FIGS. 13 and 14, a buffer layer BUF is deposited on a substrate SUBS, and a semiconductor pattern ACT is formed on the buffer layer BUF. The buffer layer BUF may be configured as a single layer formed of $SiO_2$ or a double layer formed of $SiO_2$/SiNx and has a thickness of 3,000 Å to 5,000 Å. A light shielding layer (not shown) may be disposed under the semiconductor pattern ACT, so as to prevent a leakage current resulting from a photocurrent generated when the semiconductor pattern ACT is exposed to light. The embodiment of the invention may perform a process for depositing, crystallizing, and doping a semiconductor material on the buffer layer BUF to form the semiconductor pattern ACT. A thickness of the semiconductor pattern ACT may be 500 Å to 2,000 Å.

A gate insulating layer GI is deposited on the buffer layer BUF and covers the semiconductor pattern ACT. The gate insulating layer GI has a thickness of about 500 Å to 2,000 Å and may be configured as a single layer formed of $SiO_2$ or a double layer formed of $SiO_2$/SiNx. A gate G of a TFT is formed on the gate insulating layer GI. The gate G may be configured as a single layer formed of copper (Cu), molybdenum (Mo), aluminum (Al) or titanium (Ti) or a multilayer formed of Mo/AlNd, Mo/Al, Ti/Al/Ti, or Mo/Al/Mo. The gate G has a thickness of 2,000 Å to 5,000 Å.

The semiconductor pattern ACT includes a channel region CH, a lightly doped drain (LDD) region LDD, a source region SA, and a drain region DA. The channel region CH overlaps the gate G of the TFT with the gate insulating layer GI interposed therebetween. The channel region CH is not doped with impurities.

The LDD region LDD is doped with $n^-$-type impurities of a low concentration and functions as an ohmic contact layer. As shown in FIG. 14, the embodiment of the invention firstly dopes the LDD region LDD, the source region SA, and the drain region DA of the semiconductor pattern ACT with impurities using a metal pattern of the gate G as a mask in a state where the gate G of the TFT is formed on the gate insulating layer GI. Subsequently, the embodiment of the invention deposits, exposes, and develops a photoresist to form a photoresist pattern PR covering the gate G. The embodiment of the invention secondly dopes the source region SA and the drain region DA except the LDD region LDD with impurities using the photoresist pattern PR as a mask. As a result, the LDD region LDD and the source and drain regions SA and DA of the semiconductor pattern ACT are defined by an impurity concentration.

An interlayer dielectric INT is deposited on the gate insulating layer GI and covers the gate G. The interlayer dielectric INT has a thickness of 2,000 Å to 5,000 Å and may be configured as a single layer formed of $SiO_2$ or a double layer formed of $SiO_2/SiNx$. The interlayer dielectric INT has a contact hole exposing the source region SA and the drain region DA of the semiconductor pattern ACT.

Metal patterns of a source S and a drain D of the TFT are formed on the interlayer dielectric INT and contact the source region SA and the drain region DA of the semiconductor pattern ACT through the contact hole of the interlayer dielectric INT. The metal patterns of the source S and the drain D may be configured as a single layer formed of copper (Cu), molybdenum (Mo), aluminum (Al) or titanium (Ti) or a multilayer formed of Mo/AlNd, Mo/Al, Ti/Al/Ti, or Mo/Al/Mo and have a thickness of 2,000 Å to 5,000 Å.

A passivation layer PAS is deposited on the interlayer dielectric INT and covers the TFT. The passivation layer PAS may be formed of an organic passivation material, such as photoacrylic, or an inorganic passivation material, such as SiNx, or may have a stack structure of an organic passivation layer and an inorganic passivation layer. The organic passivation layer may have a thickness of 1 μm to 3 μm, and the inorganic passivation layer may have a thickness of 1,000 Å to 3,000 Å.

As a resolution of the display device increases, the size of the subpixel decreases. Structures of the TFTs of the adjacent subpixels may be differently designed, so as to dispose a plurality of TFTs in the small-sized subpixel. For example, as shown in FIGS. 15A to 18B, when the TFTs of the adjacent subpixels are designed to have a symmetrical structure, an aperture ratio of the small-sized subpixel may be secured, and the TFTs may be disposed in the subpixel. Further, the adjacent subpixels may share the signal line with each other.

The TFTs are formed on the substrate through a photolithographic process. In the photolithographic process, an alignment error of photomasks aligned on a photoresist may be generated. When the alignment error of the photomasks is generated in a process for manufacturing the TFTs having the symmetrical structure, electrical properties of a semiconductor channel of the TFT may vary. In this instance, the result of sensing the block may be inaccurate.

The multipixel sensing method according to the embodiment of the invention causes subpixels included in each block to have the same TFT structure, thereby preventing an error in the result of sensing the block. For this, the display device according to the embodiment of the invention includes a first block having a first TFT structure, a second block having a second TFT structure different from the first TFT structure, and a sensing circuit, which simultaneously senses subpixels included in the first block through a sensing path and then simultaneously senses subpixels included in the second block through the sensing path. The first TFT structure and the second TFT structure are symmetric to each other when viewed from the plane of the display panel.

The first block and the second block may share the sensing path with each other and may be sensed in a time-divisional manner. The sensing circuit includes the sensing path and the timing controller 11 controlling the sensing path. This is described in detail with reference to FIGS. 13 to 24.

Figure 15A:
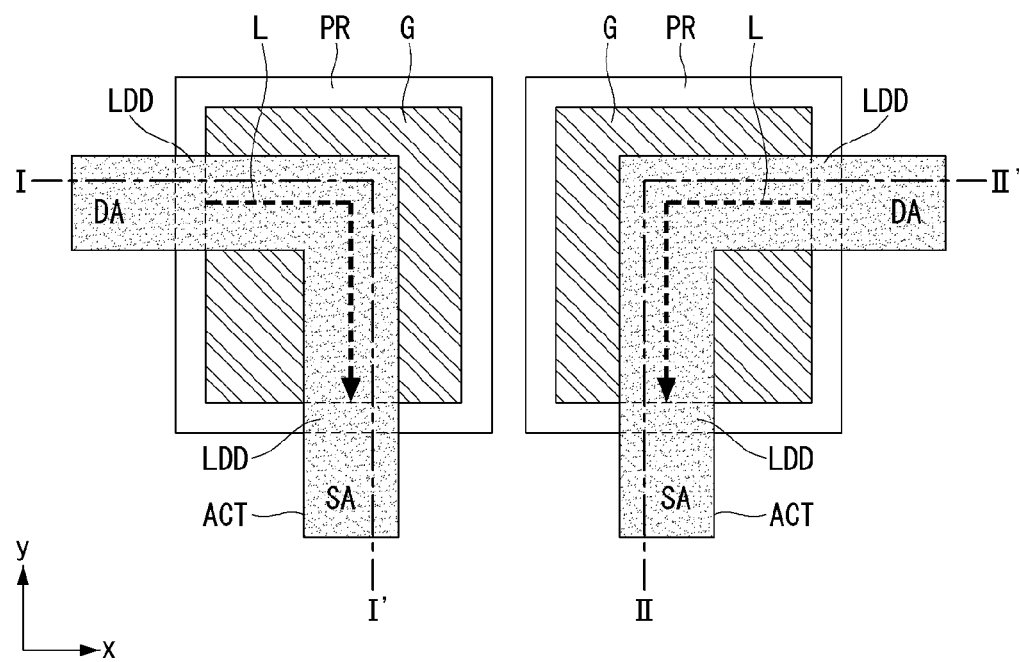
FIGS. 15A and 15B show an example where lightly doped drain regions of TFTs having a left-right symmetric structure have the same size.
Figure 15B:
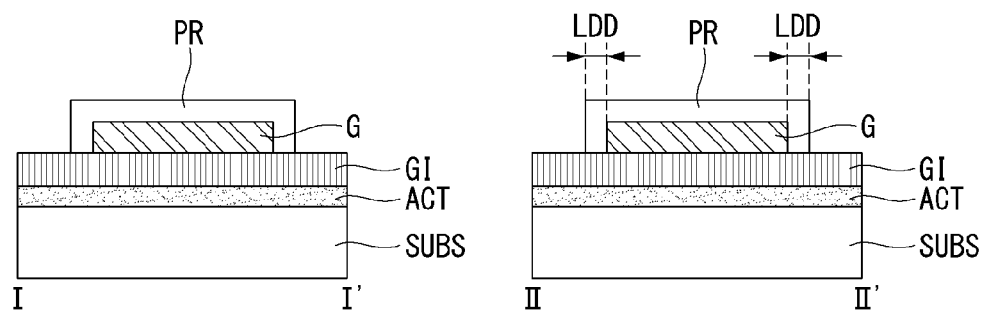
Figure 16A:
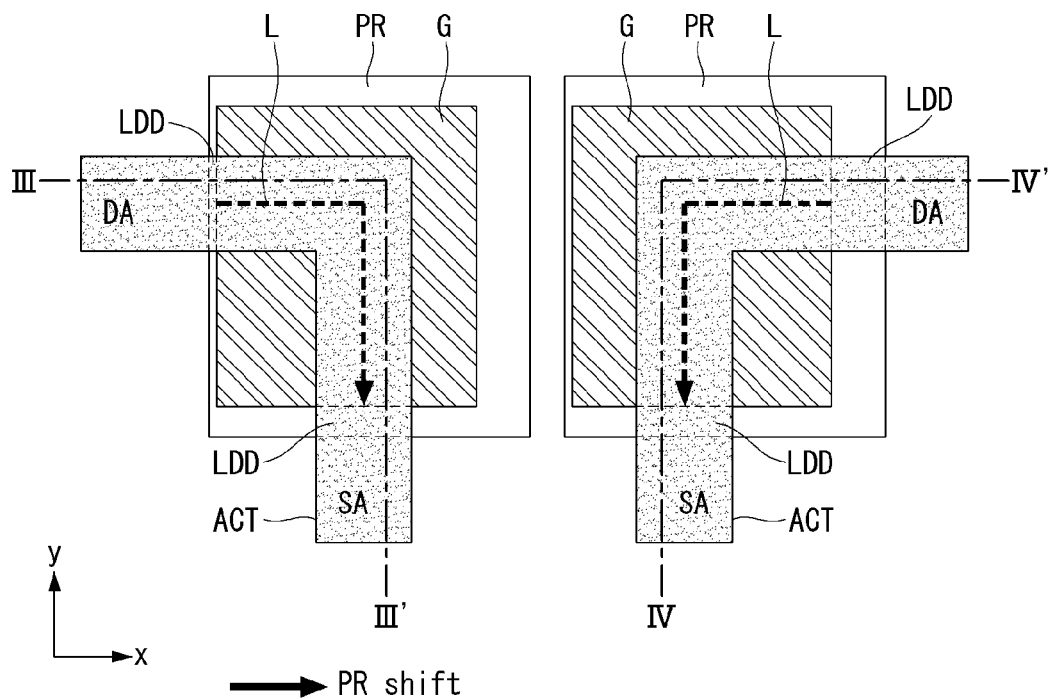
FIGS. 16A and 16B show an example where lightly doped drain regions of TFTs having a left-right symmetric structure have different sizes.
Figure 16B:
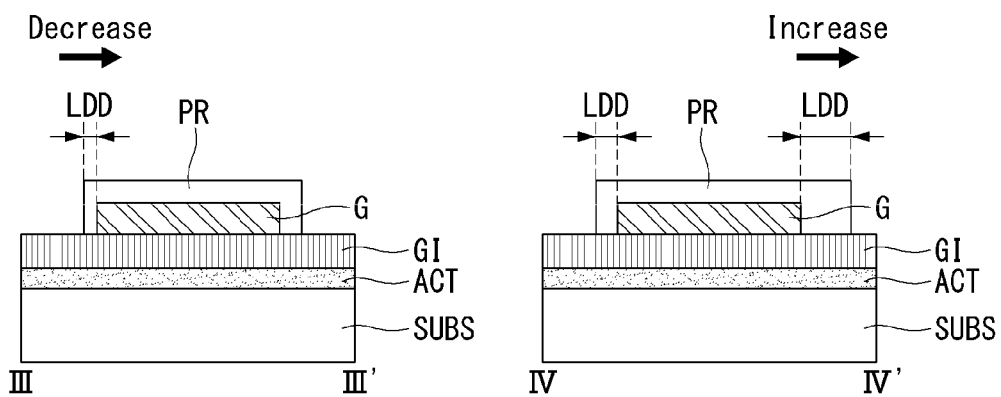
Figure 17A:
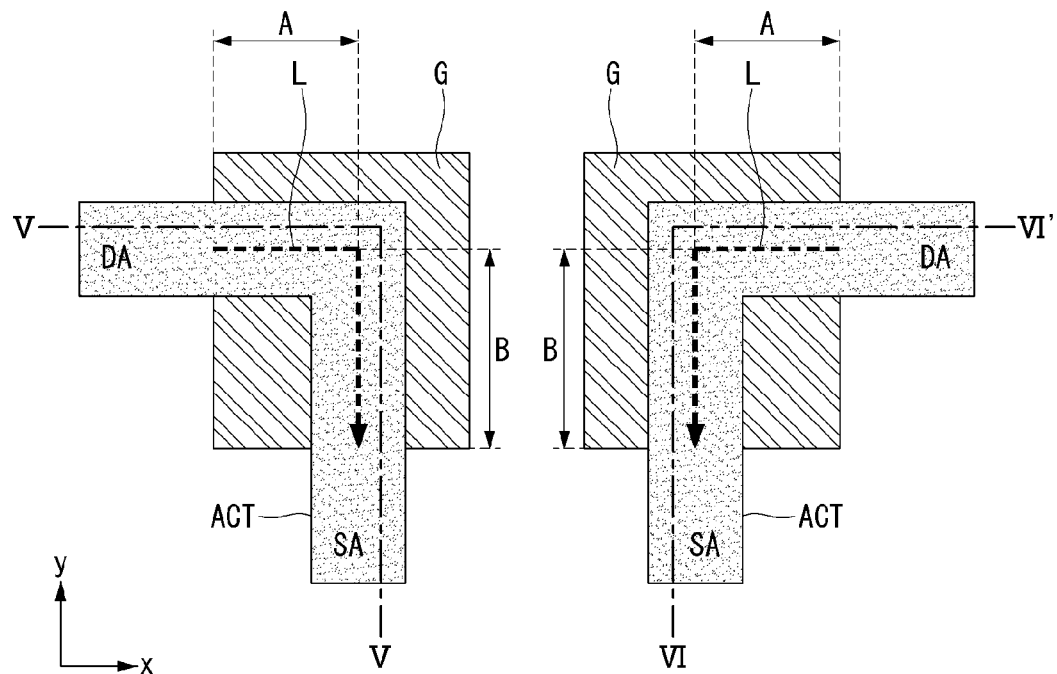
FIGS. 17A and 17B show an example where semiconductor channel regions of TFTs having a left-right symmetric structure have the same size.
Figure 17B:
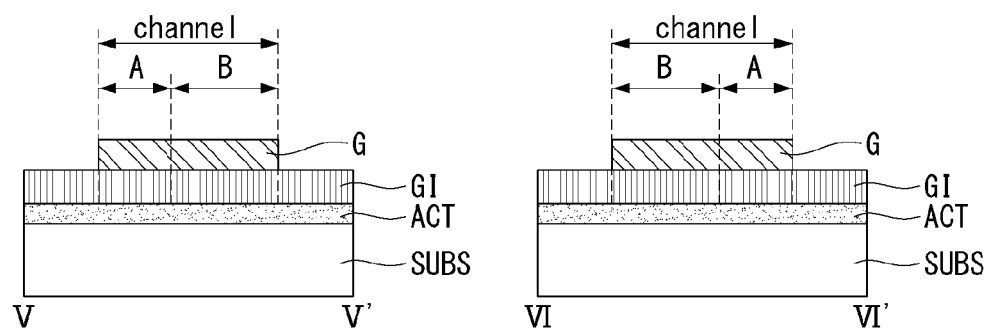
Figure 18A:
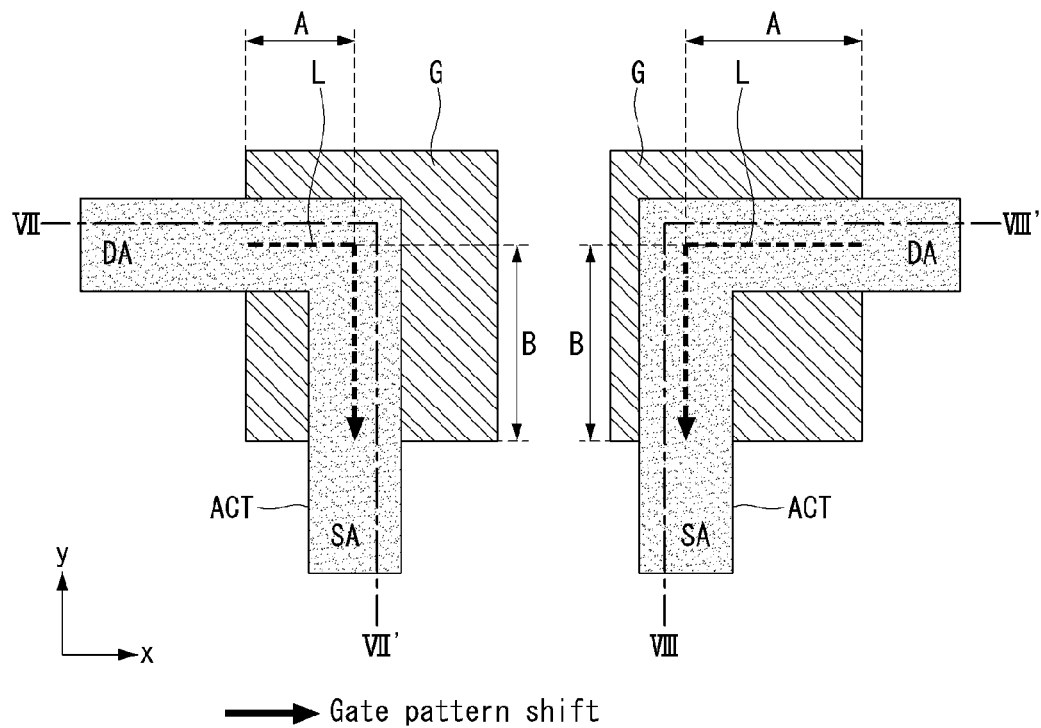
FIGS. 18A and 18B show an example where semiconductor channel regions of TFTs having a left-right symmetric structure have different sizes.
Figure 18B:
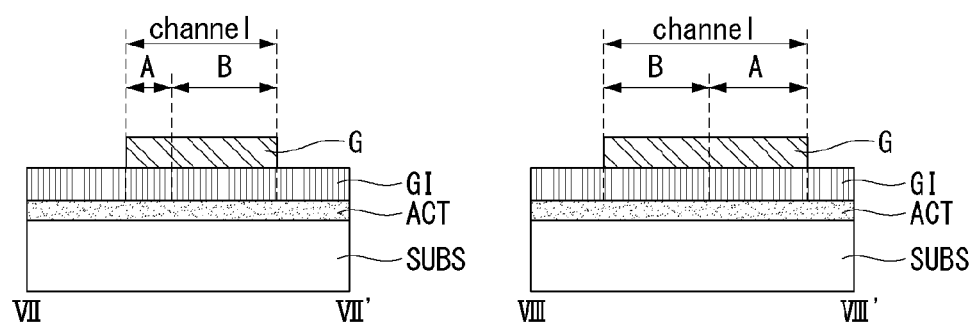

FIG. 15A shows an example where LDD regions of TFTs having a left-right symmetric structure have the same size, and FIG. 15B is cross-sectional views taken along lines I-I' and II-II' of FIG. 15A. FIG. 16A shows an example where LDD regions of TFTs having a left-right symmetric structure have different sizes, and FIG. 16B is cross-sectional views taken along lines III-III' and IV-IV' of FIG. 16A. FIG. 17A shows an example where semiconductor channel regions of TFTs having a left-right symmetric structure have the same size, and FIG. 17B is cross-sectional views taken along lines V-V' and VI-VI' of FIG. 17A. FIG. 18A shows an example where semiconductor channel regions of TFTs having a left-right symmetric structure have different sizes, and FIG. 18B is cross-sectional views taken along lines VII-VII' and VIII-VIII' of FIG. 18A.

Referring to FIGS. 15A and 15B, gates G of TFTs are patterned in a reversed L-shape. Patterns of the gates G of the TFTs of adjacent subpixels may be designed as a left-right symmetric structure. In a process for manufacturing the TFTs having the left-right symmetric structure, if there is no error of a mask, LDD regions LDD of semiconductor patterns ACT of the TFTs may have the same size and the same width. In FIG. 15A, "L" denotes a channel length.

As shown in FIGS. 16A and 16B, a photoresist pattern PR may be shifted to one side due to an alignment error of the photoresist pattern PR for defining a LDD region LDD. In this instance, the size of a LDD region of one (for example, the TFT of the left subpixel) of TFTs having a left-right symmetric structure decreases, and the size of a LDD region of the other TFT (for example, the TFT of the right subpixel) increases. A difference between the sizes of the LDD regions of the TFTs leads to a difference between channel resistances of the TFTs. When the size of the LDD region decreases as in the TFT of the left subpixel, a resistance of the LDD region decreases. Therefore, mobility of the TFT increases, and a conductance of the TFT is improved. On the other hand, when the size of the LDD region increases as in the TFT of the right subpixel, a resistance of the LDD region increases. Therefore, mobility of the TFT decreases, and a conductance of the TFT is reduced.

Referring to FIGS. 17A and 17B, gates G of TFTs are patterned in a reversed L-shape. Patterns of the gates G of the TFTs of adjacent subpixels may be designed as a left-right symmetric structure. In a process for manufacturing the TFTs having the left-right symmetric structure, if there is no error of a photomask forming a gate pattern, LDD regions LDD of semiconductor patterns ACT of the TFTs may have the same size and the same width.

As shown in FIGS. 18A and 18B, a gate pattern may be shifted to one side due to an alignment error of the gate G. In this instance, a channel length L of a semiconductor pattern of one (for example, the TFT of the left subpixel) of TFTs having a left-right symmetric structure decreases, and a channel length L of a semiconductor pattern of the other TFT (for example, the TFT of the right subpixel) increases. In FIGS. 18A and 18B, a channel length L is (A+B). When the gate G is shifted along the x-axis direction, the channel length A in the left TFT decreases, and the channel length A in the right TFT increases by a decrease of the left TFT. When the channel length A decreases as in the TFT of the left subpixel, the channel length L decreases, and a channel resistance decreases. Therefore, mobility of the TFT increases, and a conductance of the TFT is improved. On the other hand, when the channel length A increases as in the TFT of the right subpixel, the channel length L increases, and a channel resistance increases. Therefore, mobility of the TFT decreases, and a conductance of the TFT is reduced.

If the simultaneously sensed subpixels of each block are designed as a symmetric TFT structure as shown in FIGS. 14A to 18B, the sensing value of each block may be inaccurate. For example, if left and right subpixels of each block include the TFTs having the left-right symmetric structure as shown in FIGS. 14A to 18B, driving properties of the left TFT of the left subpixel and driving properties of the right TFT of the right subpixel may vary due to a difference between the sizes of the LDD regions or a difference between the channel lengths L. Hence, both the driving properties of the left TFT and the driving properties of the right TFT cannot be sensed accurately. In other words, when mobility of one (for example, the left TFT) of the TFTs having the left-right symmetric structure increases (or decreases), mobility of the other TFT (for example, the right TFT) decreases (or increases). Therefore, when the left TFT and the right TFT are together sensed through one sensing path, currents flowing through the left and right TFTs are added. As a result, a variation in the driving properties of the left and right TFTs cannot be individually sensed.

The multipixel sensing method according to the embodiment of the invention sets the subpixels having the same TFT structure as one block when the subpixels having different TFT structures are disposed in the display panel, and thus forms the plurality of blocks in the display panel. As a result, the multipixel sensing method according to the embodiment of the invention can accurately sense a variation in the driving properties of the subpixels included in each block by setting the subpixels having the same TFT structure as one block.

Figure 19:
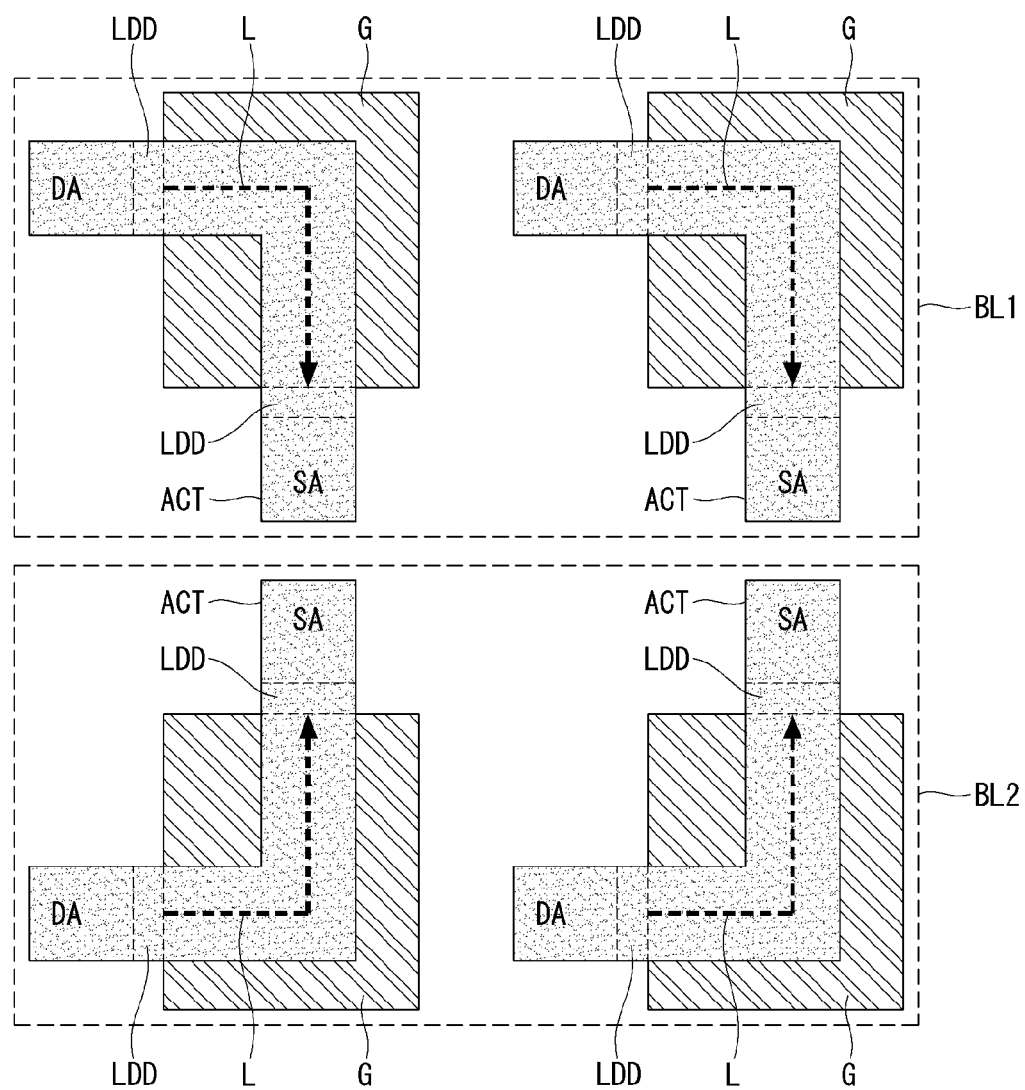
FIGS. 19 and 20 show an example where upper and lower blocks have different TFT structures.
Figure 20:
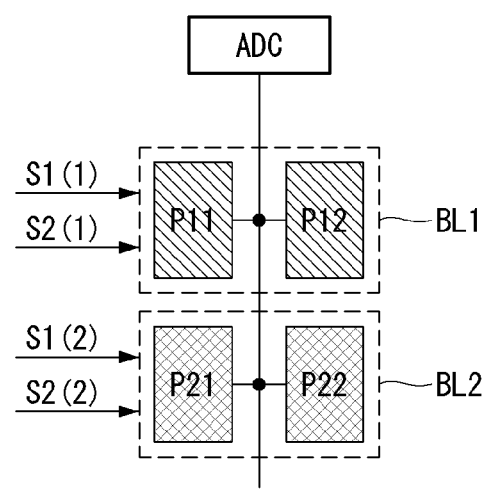

FIGS. 19 and 20 show an example where upper and lower blocks have different TFT structures. Referring to FIGS. 19 and 20, a second block BL2 is disposed under a first block BL1. The first block BL1 and the second block BL2 may share a sensing line with each other. The multipixel sensing method according to the embodiment of the invention simultaneously senses subpixels P11 and P12 included in the first block BL1 through the same sensing path and then simultaneously senses subpixels P21 and P22 included in the second block BL2 through the same sensing path. The first block BL1 and the second block BL2 have an up-down symmetric TFT structure. A pixel circuit, a sensing path, and a sensing method of the first and second blocks BL1 and BL2 are simultaneously the same as those shown in FIGS. 7 and 8. When one block includes four subpixels, a pixel circuit, a sensing path, and a sensing method of the block including the four subpixels are simultaneously the same as those shown in FIGS. 9 and 10.

Figure 21:
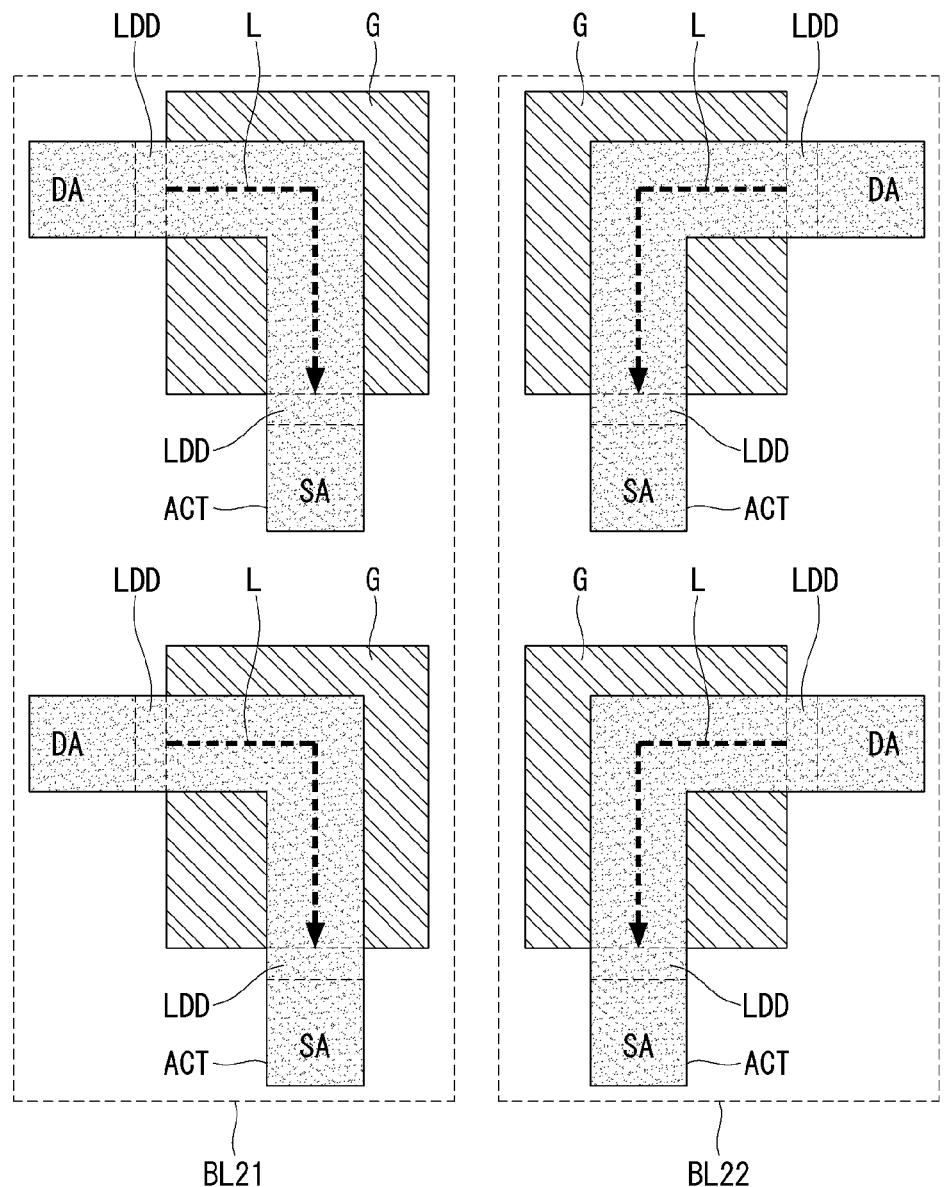
FIGS. 21 and 22 show an example where left and right blocks have different TFT structures.
Figure 22:
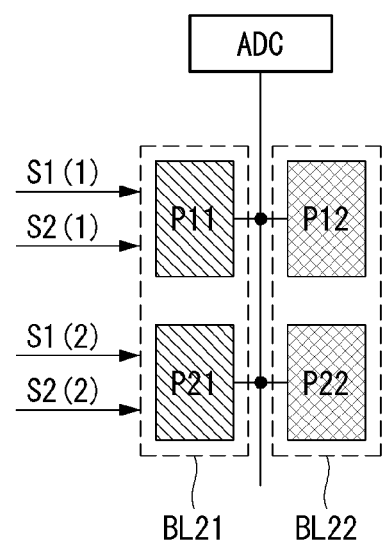
Figure 23:
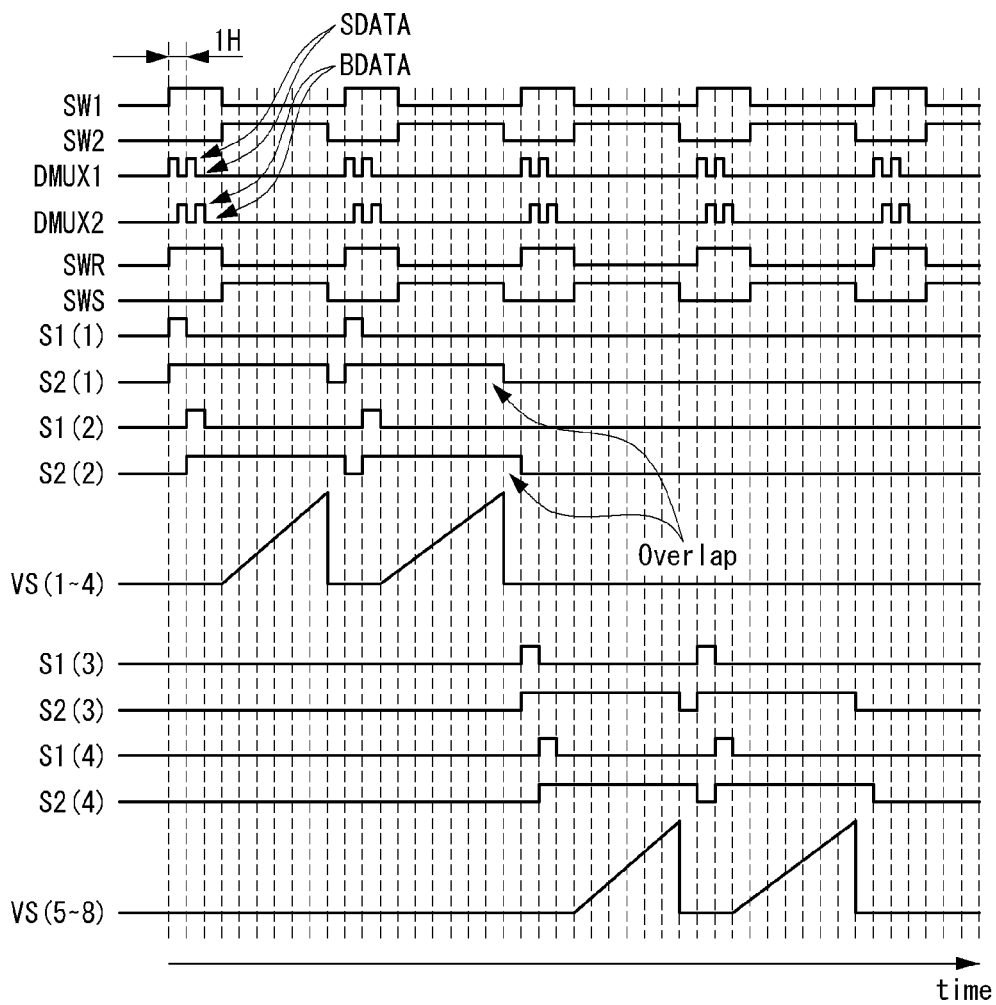
FIG. 23 is a waveform diagram showing a method for controlling a sensing path of subpixels shown in FIGS. 21 and 22.

FIGS. 21 and 22 show an example where left and right blocks have different TFT structures. FIG. 23 is a waveform diagram showing a method for controlling a sensing path of subpixels shown in FIGS. 21 and 22.

Referring to FIGS. 21 and 22, a first block BL21 and a second block BL22 are adjacent to each other in a horizontal direction. The first block BL21 and the second block BL22 may share a sensing line with each other. The multipixel sensing method according to the embodiment of the invention simultaneously senses subpixels P11 and P21 included in the first block BL21 through the same sensing path and then simultaneously senses subpixels P12 and P22 included in the second block BL22 through the same sensing path. The first block BL21 and the second block BL22 have a left-right symmetric TFT structure.

A pixel circuit, a sensing path, and a sensing method of the first and second blocks BL21 and BL22 are simultaneously the same as those shown in FIGS. 9 and 10, except the method for applying the data voltage.

Referring to FIGS. 9 and 23, the multipixel sensing method according to the embodiment of the invention writes sensing data SDATA to the subpixels P11 and P21 of the first block BL1 and causes current to flow in the subpixels P11 and P21. And at the same time, the multipixel sensing method according to the embodiment of the invention writes data BDATA of a black gray level to the subpixels P12 and P22 of the second block BL2, so as to exclude an influence of the second block BL2. When the data voltage of the black gray level is supplied to the subpixels P12 and P22, current does not flow in OLEDs of the subpixels P12 and P22. Therefore, the subpixels P12 and P22 do not emit light. Subsequently, the multipixel sensing method according to the embodiment of the invention senses the second block BL2.

The multipixel sensing method according to the embodiment of the invention writes the sensing data SDATA to the subpixels P12 and P22 of the second block BL2 and causes current to flow in the subpixels P12 and P22. And at the same time, the multipixel sensing method according to the embodiment of the invention writes data BDATA of a black gray level to the subpixels P11 and P21 of the first block BL1, so as to exclude an influence of the first block BL1. Thus, second scan pulses S2(1) and S2(2) for defining sensing timing in the first block BL1 and the second block BL2 overlap each other, but the first block BL21 and the second block BL2 are sensed by the data BDATA of the black gray level in a time-divisional manner.

Figure 24:
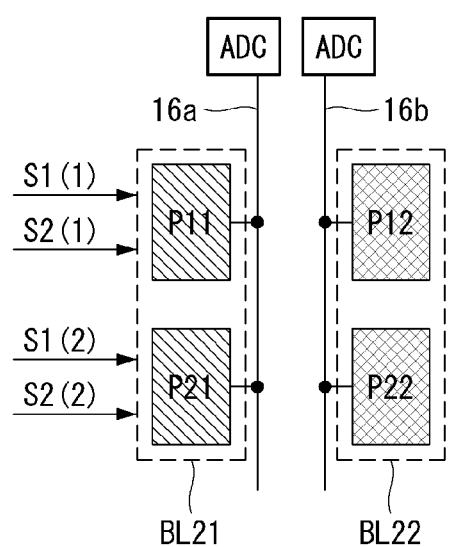
FIG. 24 shows an example where different sensing paths are connected to blocks shown in FIGS. 21 and 22.
Figure 25:
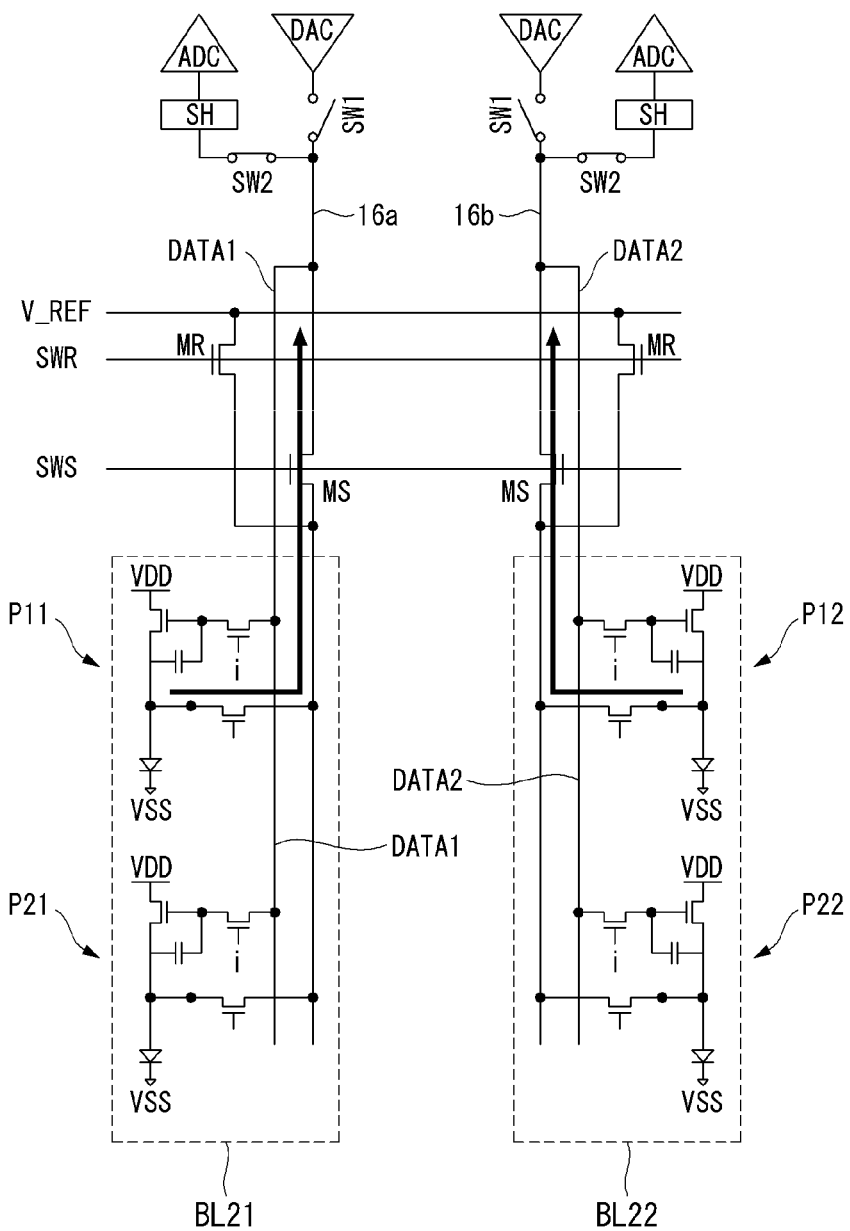
FIG. 25 is a circuit diagram showing a sensing path in a multipixel sensing method shown in FIG. 24.
Figure 26:
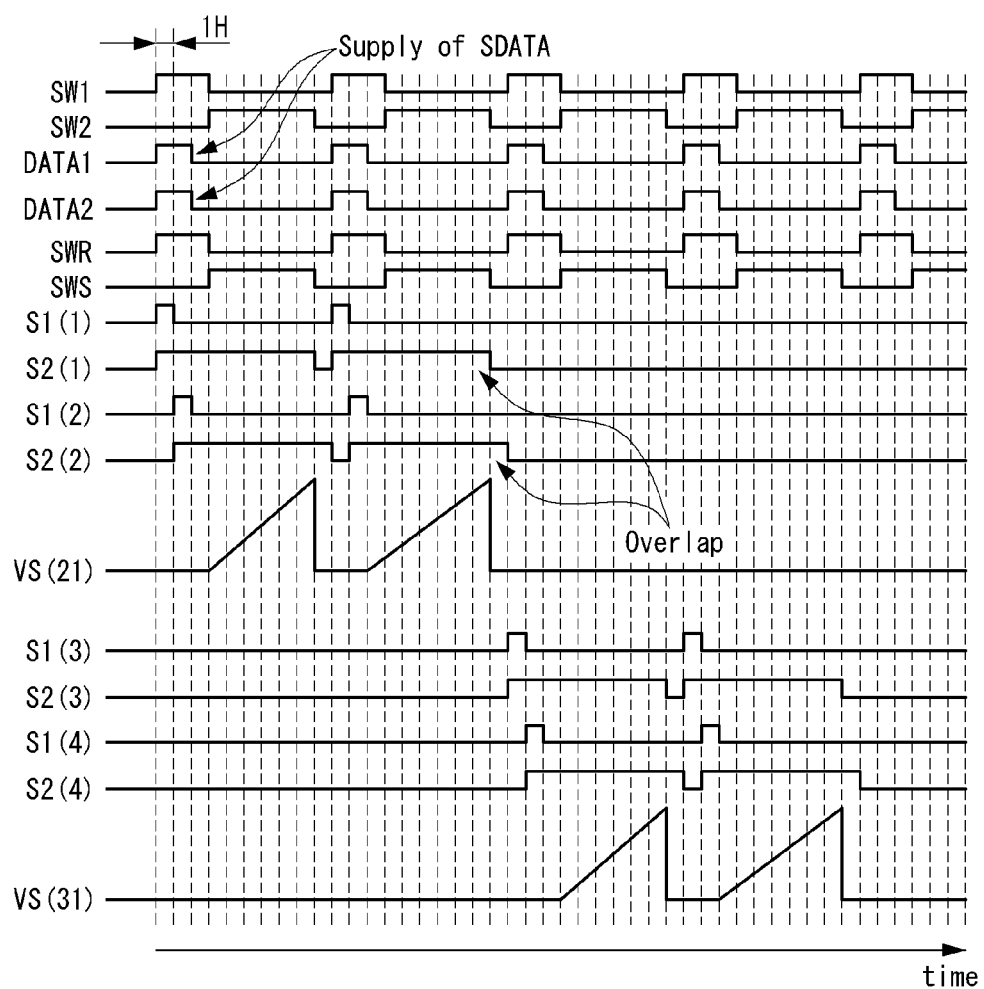
FIG. 26 is a waveform diagram showing a method for controlling subpixels and a sensing path shown in FIG. 24.

As shown in FIGS. 24 to 26, sensing paths of blocks having different TFT structures may be separated, so as to independently sense the blocks. For example, a first block BL21 may be sensed through a first sensing line 16a, and a second block BL22 may be sensed through a second sensing line 16b. As shown in FIGS. 25 and 26, when a sensing path of the first block BL21 is separated from a sensing path of the second block BL22, the multipixel sensing method according to the embodiment of the invention simultaneously writes sensing data to subpixels P11, P21, P12 and P22 of the first and second blocks BL21 and BL22 and can obtain a sensing value of each of the first and second blocks BL21 and BL22. In FIGS. 25 and 26, "DATA1" denotes a first data line connected to the first block BL21, and "DATA2" denotes a second data line connected to the second block BL22.

The subpixels of the first and second blocks BL21 and BL22 include subpixels disposed on the Nth and (N+1)th lines. The second scan pulses S2(1) and S2(2) overlap each other, so as to simultaneously sense the subpixels of the first and second blocks BL21 and BL22.

In FIG. 26, "VS(21)" denotes a sensing voltage increasing to a sum of currents flowing in the subpixels P11 and P21 of the first block BL21. The first and second blocks BL21 and BL22 are simultaneously sensed through the different sensing paths.

In FIG. 26, "VS(31)" denotes a sensing voltage obtained from one of third and fourth blocks, which are disposed under the first and second blocks BL21 and BL22 and are sensed subsequent to the first and second blocks BL21 and BL22. Subpixels of the third and fourth blocks include subpixels disposed on the (N+2)th and (N+3)th lines. Second scan pulses S2(3) and S2(4) overlap each other, so as to simultaneously sense the subpixels of the third and fourth blocks.

As described above, the embodiment of the invention simultaneously senses the plurality of subpixels sharing the sensing path and can stably sense the driving properties of the subpixels even at the low gray level. Further, the embodiment of the invention can improve the image quality by sensing the driving properties of high-resolution and high-definition subpixels and compensating for the degradation of the driving properties. Further, the embodiment of the invention can minimize the number of sensing paths of the display panel by simultaneously sensing the plurality of subpixels sharing the sensing path, thereby increasing an aperture ratio of the subpixels and reducing sensing time.

The embodiment of the invention can greatly reduce the capacity of the memory storing the sensing values by detecting the sensing value on a per block basis and thus can reduce the circuit cost.

Furthermore, the embodiment of the invention can accurately sense the variation in the driving properties of the subpixels of each block by arranging the blocks each including the subpixels having the same TFT structure in the display panel, in which the subpixels having the different TFT structures are disposed.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An organic light emitting diode display (OLED) comprising:
   a plurality of subpixels comprising first subpixels having driving transistors of a first configuration and second subpixels having driving transistors of a second configuration different from the first configuration;
   a gate driver configured to transmit scan line signals to first blocks and second blocks, each of the first blocks comprising at least two of the first subpixels but none of the second subpixels, each of the second blocks comprising at least two of the second subpixels but none of the first subpixels; and
   a sensing circuit configured to receive a combined sensing signal via a signal path connected to at least one of a first block and a second block, the combined sensing signal generated by combining sensing signals through the signal path shared by entire first subpixels in the first block or entire second subpixels in the second subpixel, each of the sensing signals representing a property of each of the first subpixels in the first block or each of the second subpixels in the second block.

2. The organic light emitting diode display of claim 1, wherein the first configuration and the second configuration are symmetric.

3. The organic light emitting diode display of claim 2, wherein the first blocks and the second blocks share the signal path to the sensing circuit.

4. The organic light emitting diode display of claim 3, wherein the first block is disposed at an upper side of the second block.

5. The organic light emitting diode display of claim 4, wherein the collective sensing signal of the first block is received at a first time via the signal path, and another collective sensing signal of the second block is received at a second time subsequent to the first time via the signal path.

6. The organic light emitting diode display of claim 3, wherein the first block is disposed on a left side of the second block.

7. The organic light emitting diode display of claim 6, wherein the collective sensing signal of the first block is received at a first time via the signal path, and another collective sensing signal of the second block is received at a second time subsequent to the first time via the signal path.

8. The organic light emitting diode display of claim 1, wherein a channel length of the first subpixels is longer than a corresponding channel length of the second subpixels.

9. The organic light emitting diode display of claim 1, wherein the sensing signals are based on current received from each of the first subpixels in the first block or each of the second subpixels in the second block.

10. The organic light emitting diode display of claim 1, further comprising a data modulator configured to modulate data to be written to each of the first subpixels in the first block or each of the second subpixels in the second block based on the combined sensing signal.

11. A method of sensing properties of subpixels in organic light emitting diode display (OLED) comprising:
    transmitting scan line signals to first blocks and second blocks by a gate driver, each of the first blocks comprising at least two of the first subpixels of a first configuration but none of the second subpixels of a second configuration different from the first configuration, each of the second blocks comprising at least two of the second subpixels but none of the first subpixels;
    generating a combined sensing signal by combining sensing signals in a signal path shared by entire first subpixels in a first block or entire second subpixels in a second block, each of the sensing signals representing a property of each of the first subpixels in the first block or each of the second subpixels in the second block; and
    sending the combined sensing signal via the signal path to a sensing circuit.

12. The method of claim 11, wherein the first configuration and the second configuration are symmetric.

13. The method of claim 12, wherein the first blocks and the second blocks share the signal path to the sensing circuit.

14. The method of claim 13, wherein the first block is disposed at an upper side of the second block.

15. The method of claim 14, wherein the collective sensing signal of the first block is received at a first time via the signal path, and another collective sensing signal of the second block is received at a second time subsequent to the first time via the signal path.

16. The method of claim 13, wherein the first block is disposed on a left side of the second block.

17. The method of claim 16, wherein the collective sensing signal of the first block is received at a first time via the signal path, and another collective sensing signal of the second block is received at a second time subsequent to the first time via the signal path.

18. The method of claim 11, wherein a channel length of the first subpixels is longer than a corresponding channel length of the second subpixels.

19. The method of claim 11, wherein the sensing signals are based on current received from each of the first subpixels in the first block or each of the second subpixels in the second block.

20. The method of claim 11, further comprising:
    storing properties of the first subpixels in the first block or the second subpixels in the second block as indicated by the combined sensing signal in the sensing circuit; and modulating data to be written to first subpixels in the first block or each of the second subpixels in the second block based on the stored properties.

\* \* \* \* \*